(12) United States Patent
Mashita et al.

(10) Patent No.: US 7,716,617 B2
(45) Date of Patent: May 11, 2010

(54) SEMICONDUCTOR DEVICE, METHOD FOR MAKING PATTERN LAYOUT, METHOD FOR MAKING MASK PATTERN, METHOD FOR MAKING LAYOUT, METHOD FOR MANUFACTURING PHOTO MASK, PHOTO MASK, AND METHOD FOR MANUFACTURING SEMICONDUCTOR DEVICE

(75) Inventors: Hiromitsu Mashita, Sagamihara (JP); Toshiya Kotani, Machida (JP); Atsushi Maesono, Yokohama (JP); Ayako Nakano, Yokohama (JP); Tadahito Fujisawa, Yokkaichi (JP)

(73) Assignee: Kabushiki Kaisha Tosbhia, Tokyo (JP)

( * ) Notice: Subject to any disclaimer, the term of this patent is extended or adjusted under 35 U.S.C. 154(b) by 1157 days.

(21) Appl. No.: 11/299,843

(22) Filed: Dec. 13, 2005

(65) Prior Publication Data
US 2006/0157833 A1    Jul. 20, 2006

(30) Foreign Application Priority Data
Dec. 13, 2004   (JP)   .............. 2004-360109
Feb. 23, 2005   (JP)   .............. 2005-047461

(51) Int. Cl.
G06F 17/50   (2006.01)
H03K 19/177  (2006.01)
H01L 25/00   (2006.01)

(52) U.S. Cl. .............. 716/9; 716/10; 716/13; 716/14; 326/41; 326/47; 326/101

(58) Field of Classification Search ............ 326/41, 326/47, 101; 716/9, 10, 13, 14
See application file for complete search history.

(56) References Cited

U.S. PATENT DOCUMENTS

| | | | |
|---|---|---|---|
| 5,034,899 A | * | 7/1991 | Schult ............... 345/441 |
| 5,224,056 A | * | 6/1993 | Chene et al. ........... 716/7 |
| 5,513,124 A | * | 4/1996 | Trimberger et al. ...... 716/7 |
| 5,894,565 A | * | 4/1999 | Furtek et al. .......... 326/38 |
| 6,080,206 A | * | 6/2000 | Tadokoro et al. ....... 716/10 |
| 6,167,558 A | * | 12/2000 | Trimberger ........... 716/16 |
| 6,209,123 B1 | * | 3/2001 | Maziasz et al. ........ 716/14 |

(Continued)

FOREIGN PATENT DOCUMENTS

JP    2001-013668    1/2001

(Continued)

*Primary Examiner*—Phallaka Kik
(74) *Attorney, Agent, or Firm*—Finnegan, Henderson, Farabow, Garrett & Dunner, L.L.P.

(57) ABSTRACT

A semiconductor device includes a semiconductor substrate, and a circuit pattern group comprising at least N ($\geq 2$) circuit pattern on the semiconductor substrate, at least one vicinity of end portion among the at least of N circuit patterns including a connection area to electrically connect to a circuit pattern in another circuit pattern group different from the circuit pattern group, the at least N wirings pattern including a circuit pattern N1 and at least one circuit pattern Ni ($i \geq 2$) arranged in one direction different from longitudinal direction of the circuit pattern N1, the at least one circuit patterns Ni having larger i being arranged at further position away from the circuit pattern N1, and in terms of a pattern including the connection area among the at least of Ni circuit patterns, the larger the i, the connection area being arranged at a further position in longitudinal direction.

9 Claims, 33 Drawing Sheets

U.S. PATENT DOCUMENTS

| | | | |
|---|---|---|---|
| 6,236,228 B1 * | 5/2001 | Chaisemartin | 326/10 |
| 6,586,961 B2 * | 7/2003 | Chaisemartin | 326/10 |
| 6,711,727 B1 * | 3/2004 | Teig et al. | 716/12 |
| 6,763,511 B2 * | 7/2004 | Banno et al. | 716/12 |
| 7,180,324 B2 * | 2/2007 | Chan et al. | 326/10 |
| 2004/0010767 A1 * | 1/2004 | Agrawal et al. | 716/16 |
| 2005/0273747 A1 * | 12/2005 | Malhotra et al. | 716/13 |
| 2005/0273748 A1 * | 12/2005 | Hetzel et al. | 716/14 |

FOREIGN PATENT DOCUMENTS

| | | |
|---|---|---|
| JP | 2002-064043 | 2/2002 |
| JP | 2003-017390 | 1/2003 |

* cited by examiner

Coverage : 0%

Coverage : 50%

Coverage : 100%

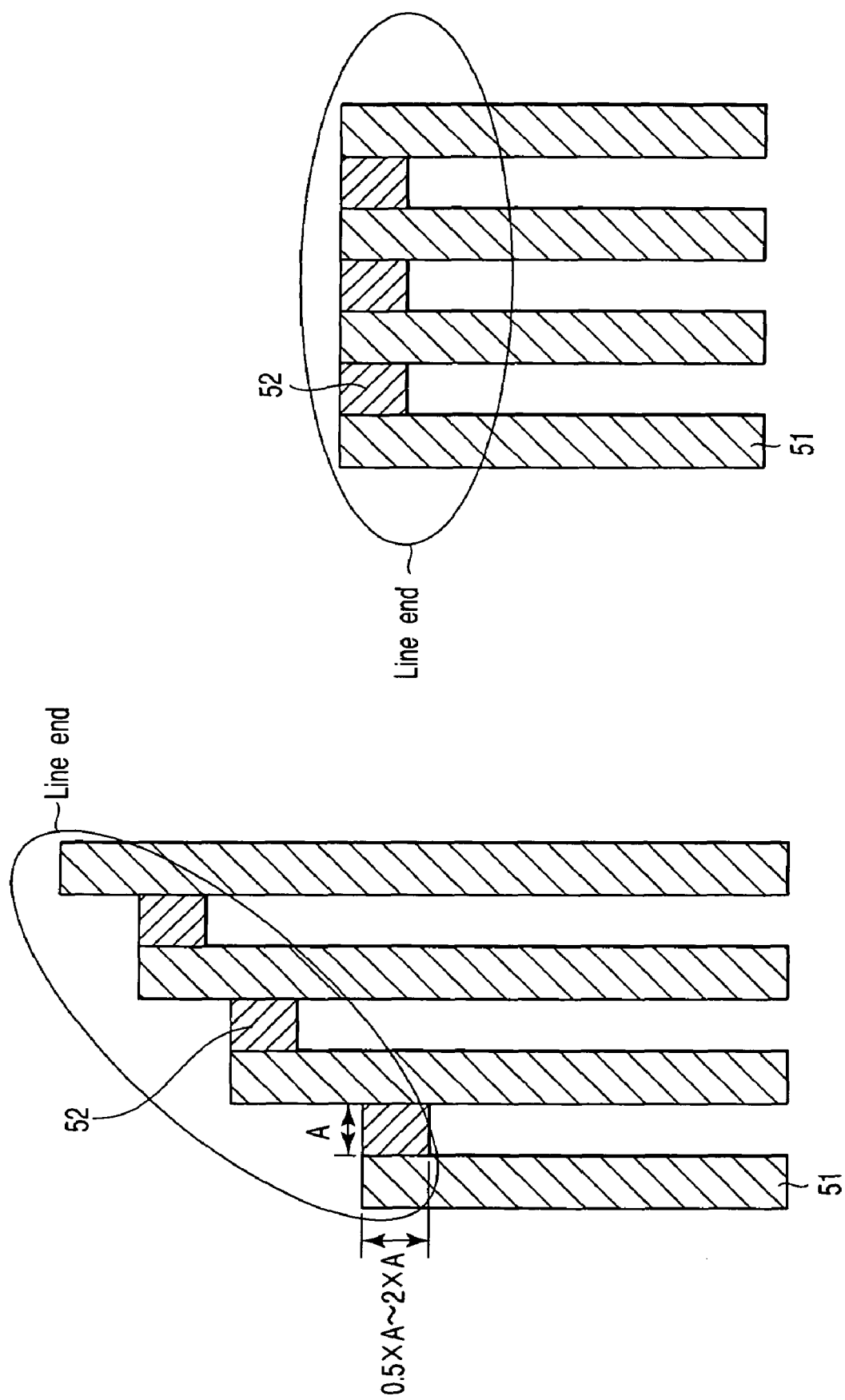

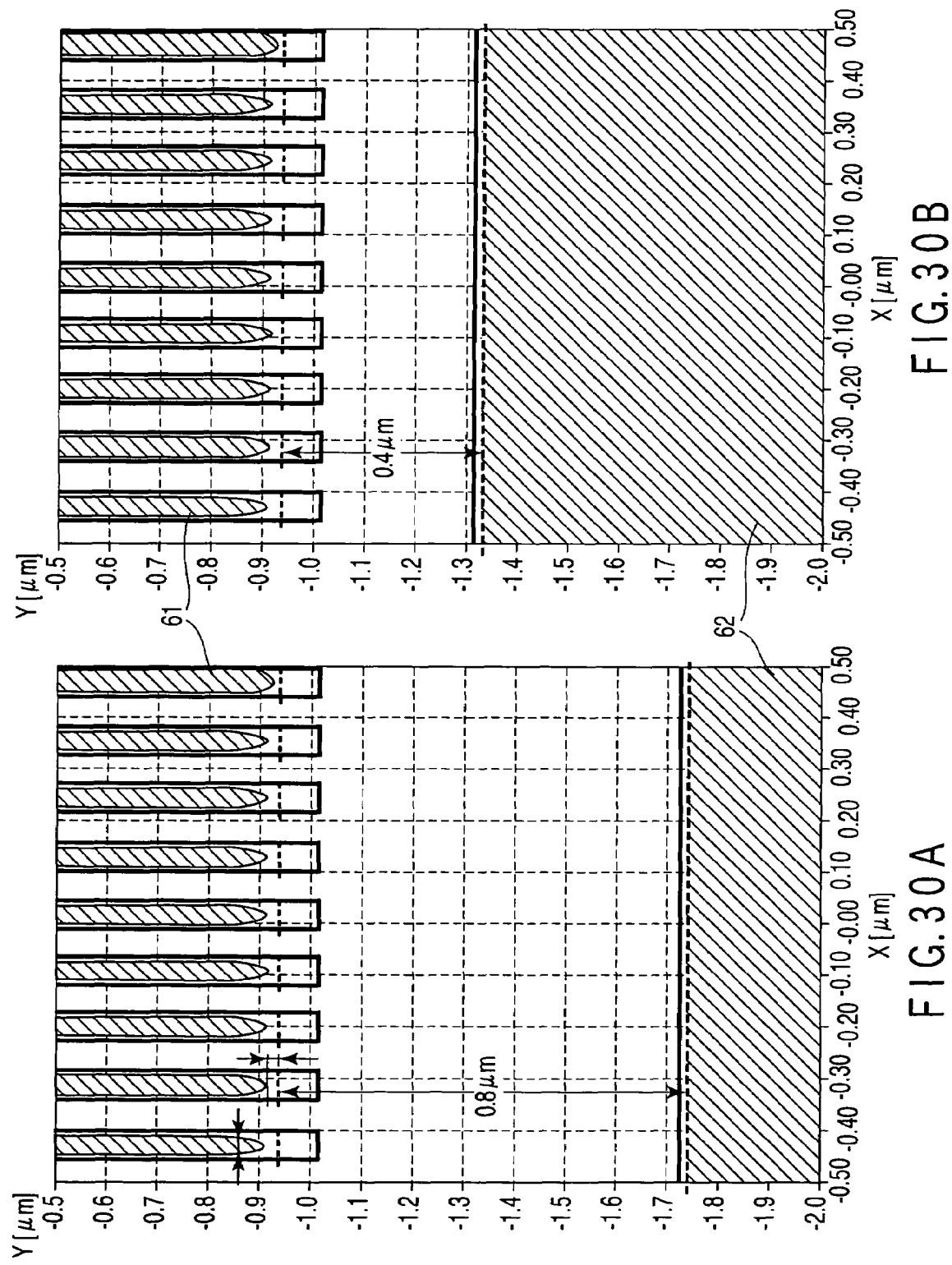

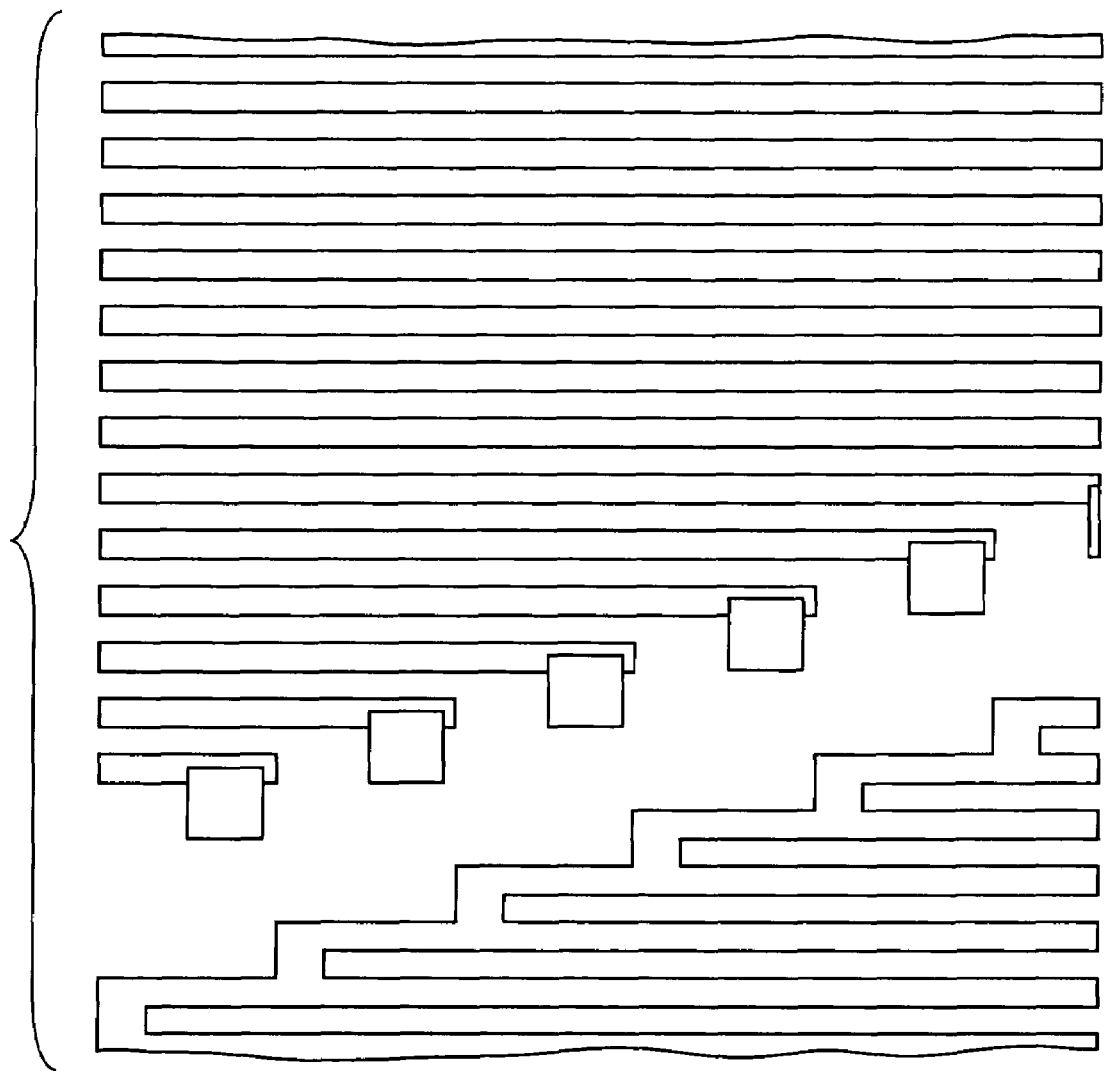
F I G. 38

SEMICONDUCTOR DEVICE, METHOD FOR MAKING PATTERN LAYOUT, METHOD FOR MAKING MASK PATTERN, METHOD FOR MAKING LAYOUT, METHOD FOR MANUFACTURING PHOTO MASK, PHOTO MASK, AND METHOD FOR MANUFACTURING SEMICONDUCTOR DEVICE

CROSS-REFERENCE TO RELATED APPLICATIONS

This application is based upon and claims the benefit of priority from prior Japanese Patent Applications No. 2004-360109, filed Dec. 13, 2004; and No. 2005-047461, filed Feb. 23, 2005, the entire contents of both of which are incorporated herein by reference.

BACKGROUND OF THE INVENTION

1. Field of the Invention

The present invention relates to a semiconductor device comprising a circuit pattern group including metal wire, gate, diffusion, dummy and so on, a method for making a pattern layout of a plurality of circuit patterns in a circuit pattern group, further a method for making a mask pattern based on design data of a semiconductor device, a method for manufacturing a photo mask by using the method for making a mask pattern; a photo mask; a method for manufacturing a semiconductor device using the photo mask, and a method for making a layout to correct design data.

2. Description of the Related Art

Recently, technologies for manufacturing a semiconductor have been remarkably developed. Currently, a semiconductor device with a minimum processing dimension of 90 nm has been mass-produced. Miniaturization of the semiconductor device is realized by rapid development in the fine pattern forming technology. As a typical fine pattern forming technology, a mask process technology, a lithography process technology, and an etching process technology may be referred.

In an age that a pattern size is very large, a mask comprising a mask pattern which is the same shape as that of a design pattern is made, the mask is set in an aligner, and a pattern is comparatively easily formed on a wafer as designed by transferring the mask pattern onto a resist applied on the wafer.

However, it is difficult to form a pattern on a wafer as designed because a pattern size becomes smaller at present. The reason is that diffraction of exposure light has a large influence on the dimension of a pattern on a wafer, it is difficult to manufacture a mask for forming a fine pattern and a fine pattern on a wafer is difficult with high accuracy.

Correction methods such as called optical proximity correction (OPC), and process proximity correction (PPC) (Jpn. Pat. Appln. KOKAI Publication Nos. 2001-13668, and 2003-17390) is known as a technology to improve the fidelity of a design pattern.

The correction method such as OPC and PPC (hereinafter, both of OPC and PPC will be expressed as PPC) is roughly classified into rule based PPC, and model-based PPC.

The rule based PPC is a method by which a moving amount of an edge forming the design pattern is defined as a rule (table) according to the width of a design pattern, the nearest distance between patterns, and the like, and the optimal moving amount (correction amount) of the edge is acquired according to the rule (table).

On the other hand, in the model-based PPC, the optimal moving amount (correction amount) of the edge is acquired in such a way that the same pattern as a design pattern is formed on a wafer by using a lithography simulator by which the diffracted light intensity distribution of the exposure light can be estimated with high accuracy.

There has been also proposed another correction method for realizing higher accuracy by combining the rule based PPC and the model-based PPC.

Recently, not only PPC (a technology correcting a mask pattern), but also a technology modifying design pattern for improving the process margin, called target mask data processing (MDP) is also proposed.

In the target MDP processing, a specific kind of a pattern which is estimated difficult to be formed on a wafer is corrected in such a way that the specific kind of pattern is easily formed on the wafer.

In the target MDP processing, a final design pattern is changed to a pattern different from an original one made by a designer. Thereby, it is required to promote the target MDP processing after gaining the consent of the designer beforehand on how to change the pattern. Accordingly, operation of the target MDP processing is complex.

It has been difficult in recent years to secure a process margin in lithography process. Thereby, a technology by which the shape of a design pattern is changed in a more complex manner is required for the target MDP processing. However, it is difficult to establish such a technology for changing the pattern.

Incidentally, a NAND type flash memory has been known as one of nonvolatile semiconductor storage device. The NAND type flash memory comprises a memory cell array connecting a plurality of memory cells in series. The memory cell comprises a MOS structure in which a floating gate and a control gate are accumulated. The NAND type flash memory has a merit that it is suitable for high integration.

However, as mentioned above, the development of the lithography process is not good enough to the miniaturization of the semiconductor device, it has been in a situation that higher integration of the NAND type flash memory is difficult. Specifically, the higher integration can not be realized when a conventional circuit pattern layout for the NAND type flash memory (Jpn. Pat. Appln. KOKAI Publication No. 2002-64043) is reduced as it is.

BRIEF SUMMARY OF THE INVENTION

According to an aspect of the present invention, there is provided a semiconductor device comprising: a semiconductor substrate; and a circuit pattern group comprising at least N ($N \geq 2$) pieces of circuit patterns provided on the semiconductor substrate, at least one vicinity of end portion among the at least of N pieces of circuit patterns including a connection area to electrically connect to a circuit pattern in another circuit pattern group being different from the circuit pattern group, the N pieces of circuit patterns including a circuit pattern N1 and at least one circuit pattern Ni ($i \geq 2$) arranged in one direction being different from a longitudinal direction of the circuit pattern N1, the at least one circuit pattern Ni having larger i being arranged at a further position away from the circuit pattern N1, and in terms of a pattern including the connection area among the at least of N pieces of circuit patterns, the larger the i, the connection area being arranged at a further position in the longitudinal direction.

According to another aspect of the present invention, there is provided a semiconductor device comprising: a semiconductor substrate; and a circuit pattern group comprising at least N (N≧3) pieces of circuit patterns provided on the semiconductor substrate, at least one of the N pieces of the circuit patterns including a connection area to electrically connect to a circuit pattern in another circuit pattern group being different from the circuit pattern group, the N pieces of the circuit patterns including a circuit pattern N1 and at least two circuit patterns Ni (i≧2) arranged in one direction being different from a longitudinal direction of the circuit pattern N1, the at least two circuit patterns Ni having larger i being arranged at a further position away from the circuit pattern N1, the at least two circuit patterns Ni including at least one circuit patterns Np (2≦p<N) and at least one circuit patterns Nq (p<q≦N), the at least one circuit pattern Np having larger p including a longer dimension in the longitudinal direction, and the at least one circuit pattern Nq having larger q including a shorter dimension in the longitudinal direction.

According to an aspect of the present invention, there is provided a method for making a pattern layout, comprising: defining a circuit pattern N1 as a reference for arranging N (N≧2) pieces of circuit patterns in a circuit pattern group, the each of N pieces of the circuit patterns including a connection area to electrically connect to a circuit pattern in another circuit pattern group being different from the circuit pattern group; arranging at least one circuit pattern Ni (i≧2) in one direction being different from a longitudinal direction of the circuit pattern N1, the at least one circuit pattern Ni having larger i being arranged at a further position away from the circuit pattern N1; and enlarging the at least one circuit pattern Ni in the longitudinal direction, the at least one circuit pattern Ni having larger i being enlarged larger.

According to another aspect of the present invention, there is provided a method for making a pattern layout, comprising: defining a circuit pattern N1 and a circuit pattern N1' as a reference for arranging N (N≧3) pieces of circuit patterns in a circuit pattern group, the circuit pattern N1 and the circuit pattern N1' having same longitudinal direction, the circuit pattern N1' being arranged at a position away from the circuit pattern N1 by a constant distance in one direction being different from the longitudinal direction, and each of N pieces of the circuit patterns including a connection area to electrically connect to a circuit pattern in a circuit pattern group being different from the circuit pattern group; arranging the N pieces (N≧3) of the circuit patterns except the circuit patterns N1 and N1' between the circuit patterns N1 and N1' including arranging at least circuit pattern Np (2≦p<N), the at least circuit pattern Np having larger p being arranged at a further position away from the circuit pattern N1, in a case where at least circuit pattern Np (p<q<N) is remained in the N pieces (N≧3) of the circuit patterns except the circuit patterns N1 and N1' after the arranging the at least circuit pattern Np, arranging at least circuit pattern Nq, the at least circuit pattern Nq having larger q being arranged at a further position away from the circuit pattern N1'; and enlarging the at least one circuit pattern Np in the longitudinal direction, the at least one circuit pattern Np having larger p being more enlarged including in a case where at least circuit pattern Nq is remained, shortening the at least circuit pattern Nq in the longitudinal direction, the at least circuit pattern Nq having larger q being more shortened and enlarging or shortening dimension in the longitudinal direction of the circuit pattern Nq having smallest q than that of the circuit pattern Np having larges p.

According to an aspect of the present invention, there is provided a photo mask, comprising: a transparent substrate which is transparent to light for exposure; and a pattern corresponding to a plurality of circuit pattern of a circuit pattern group comprising at least N (N≧2) pieces of circuit patterns provided on the semiconductor substrate, at least one vicinity of end portion among the at least of N pieces of circuit patterns including a connection area to electrically connect to a circuit pattern in another circuit pattern group being different from the circuit pattern group, the N pieces of circuit patterns including a circuit pattern N1 and at least one circuit pattern Ni (i≧2) arranged in one direction being different from a longitudinal direction of the circuit pattern N1, the at least one circuit pattern Ni having larger i being arranged at a further position away from the circuit pattern N1, and at least one connection area in and in terms of at least one circuit pattern including the connection area among the at least one circuit pattern Ni, the larger the i, the connection area being arranged at a further position in the longitudinal direction.

According to an aspect of the present invention, there is provided a method for making a mask pattern, comprising: recognizing a dummy pattern which does not effect on device operation among design data of a semiconductor device corresponding to a pattern to be formed on a substrate, the dummy pattern including a line or a space; extracting an end portion of the line or end portion of a space in the recognized dummy pattern; and arranging a common dummy pattern newly to connect the extracted end portion and a dummy pattern adjacent to the end portion.

According to another aspect of the present invention, there is provided a method for making a mask pattern, comprising: extracting an end portion of a line or end portion of a space forming a device pattern among design data of a semiconductor device corresponding to a pattern to be formed on a substrate; measuring a relation between a distance S between the extracted end portion and a pattern opposing to the end portion, and a finished resist dimension of a line end portion by lithography processing; measuring a relation between the distance S and a conversion difference of line end portion cased by adhesion of sidewall deposition by etching using resist as mask; determining value of the distance S such that dimension of line end portion making consideration of finished resist dimension and its conversion difference falls in predetermined dimension; and arranging a pattern at a position of the distance S.

According to an aspect of the present invention, there is provided a photo mask comprising: a substrate; a circuit pattern of a semiconductor device provided on the substrate; and a dummy pattern provided on the substrate, the dummy pattern including a line or a space, and an end of the line or end of the space is connected to an adjacent dummy pattern through a common pattern.

According to an aspect of the present invention, there is provided a method for manufacturing a semiconductor device, comprising: preparing a photo mask, the photo mask comprising a mask substrate; a circuit pattern of a semiconductor device provided on the mask substrate; and a dummy pattern provided on the mask substrate, the dummy pattern including a line or a space, and an end of the line or end of the space being connected to an adjacent dummy pattern through a common pattern; and forming the circuit pattern of the semiconductor device on a resist on the semiconductor substrate using the photo mask.

According to an aspect of the present invention, there is provided a method for making a layout, comprising: recognizing a dummy pattern which does not effect on device operation among design data, the dummy pattern including a line or space; extracting an end portion of the line or end portion of the space in the recognized dummy pattern; arranging a common dummy pattern newly to connect the extracted end portion and a dummy pattern adjacent to the end portion; and registering a layout in which the common dummy pattern is arranged as new design data.

According to another aspect of the present invention, there is provided a method for making a layout, comprising: extracting an end portion of a line or end portion of a space among design data; measuring a relation between a distance S between the extracted end portion and a pattern opposing to the end portion, and a finished resist dimension of a line end portion by lithography processing; measuring a relation between the distance S and a conversion difference of line end portion cased by adhesion of sidewall deposition by etching using resist as mask; determining value of the distance S such that dimension of line end portion making consideration of finished resist dimension and its conversion difference falls in predetermined dimension; arranging a pattern at a position of the distance S; and registering a layout in which a pattern is arranged at the distance S as new design data.

BRIEF DESCRIPTION OF THE SEVERAL VIEWS OF THE DRAWING

FIGS. 29A and 29B is a view showing a state in which the tip portion of a dummy pattern is shared;

FIGS. 30A and 30B are views each showing a finished shape on a wafer after lithography process of a tip portion at a line end portion according to the embodiment;

FIG. 38 a plan view showing a layout of another CG wiring pattern according to the embodiment.

DETAILED DESCRIPTION OF THE INVENTION

Hereinafter, embodiments according to the present invention will be explained with reference to the accompanying drawings.

First Embodiment

Figure 1:
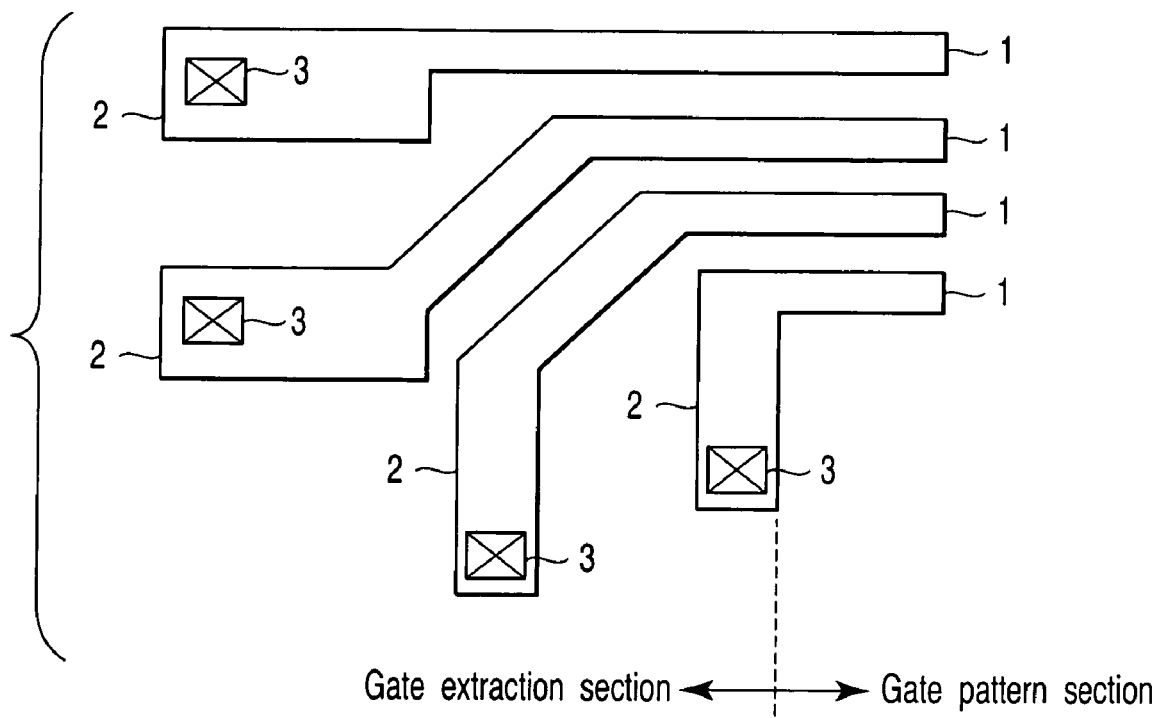
FIG. 1 is a plan view showing the layout of a conventional CG wiring pattern for a NAND type flash memory.

FIG. 1 shows a conventional control gate wiring pattern (CG wiring pattern) for a NAND type flash memory corresponding to the 65 nm generation one. FIG. 1 shows four CG wiring patterns 1.

The CG wiring pattern 1 comprises a portion (gate pattern section) which is a main body of the CG wiring pattern, and a portion (gate extraction section) which electrically connects the gate pattern section to a circuit pattern on another layer. FIG. 1 shows the gate pattern section (main pattern section) on the right side of a dotted line, and the gate extraction section on the left side of the dotted line.

Generally, the boundary between the gate pattern section and the gate extraction section is determined, based on the influence of exposure (exposure latitude). In general, the gate pattern section is provided in an area (area with larger exposure latitude) with a lower influence of exposure than that of the gate extraction section.

The gate extraction section comprises a portion called a fringe 2. Electrical connection to a circuit pattern on another layer is made in the fringe 2. In FIG. 1, a reference numeral 3 denotes a contacting section between the fringe 2 and the circuit pattern on another layer. Hereinafter, a portion which is included in the gate extraction section, and excludes the fringe 2 is called an extracting wiring section.

When the area of the fringe 2 is small, there is a possibility that a contact failure is caused by misalignment in exposure step. Accordingly, the fringe 2 is required to have a certain size of area. However, this requirement prevents reduction in the size of the device (higher integration).

As shown in FIG. 1, the gate extraction section of the four CG wiring patterns 1 has an irregular pattern layout. The reason is that the layout of the four CG wiring patterns 1 (CG wiring pattern layout) is determined in such a way that the fringe 2 with a required size of area is arranged.

On the other hand, a fine CG wiring pattern has been formed by lithography process using modified illumination in recent years. In the lithography process using the modified illumination, it is very difficult to form a pattern layout other than a line and space (L&S) pattern layout, that is, an irregular pattern layout.

As described above, the CG wiring pattern layout shown in FIG. 1 lacks regularity due to the arrangement of the fringes 2. Accordingly, it is very difficult to form the gate extraction section shown in FIG. 1 by lithography process using the modified illumination. That is, the conventional lithography process using the modified illumination is not compatible with the conventional CG wiring pattern layout.

Incidentally, in the NAND type flash memory, a state that a CG wiring pattern (first CG wiring pattern) applied high voltage lies next to a CG wiring pattern (second CG wiring pattern) not applied voltage may be occur.

At this time, there is a possibility of danger that the high voltage applied to the first CG wiring pattern influences the second CG wiring pattern, or an electrical breakdown occurs between the first CG wiring pattern and the second CG wiring pattern.

Therefore, the first CG wiring pattern and the second CG wiring pattern are required to be arranged in such a way that a distance between at least a portion to which the high voltage of the first CG wiring pattern is applied and the second CG wiring pattern does not cause the above described danger (electrical breakdown and the like). However, this prevents the miniaturization (higher integration).

Moreover, there is a possibility of danger that a contact plug is formed to reach an isolation region (STI) when misalignment is caused between a contact hole and the isolation region. In this case, a disadvantage that the isolation is applied with voltage occurs.

In order to prevent the above described disadvantage, the size of the fringe is required to be increased by the corresponding amount to possible misalignment. However, the above requirement prevents the higher integration.

In the present embodiment, a NAND type flash memory comprising a circuit pattern group including a plurality of circuit patterns (here, control CG wiring pattern) which is effective to realize an integrated semiconductor memory circuit on a wafer even if the integration of memory cells is advanced will be explained.

Here, a 45 nm generation NAND type flash memory will be explained. Accordingly, the modified illumination is used for photolithography process to manufacture the NAND type flash memory. The present embodiment can be applied to a 65 nm generation NAND type flash memory, a 55 nm generation one, or a NAND type flash memory of a generation smaller than the 45 nm generation one, which is more advanced with regard to reduction in the size (higher integration). There is a case in which the modified illumination is not required, depending on the degree of the reduced size (degree of integration). Generally, the modified illumination is required to be used for a generation which the miniaturization (high integration) is advanced.

Figure 2:
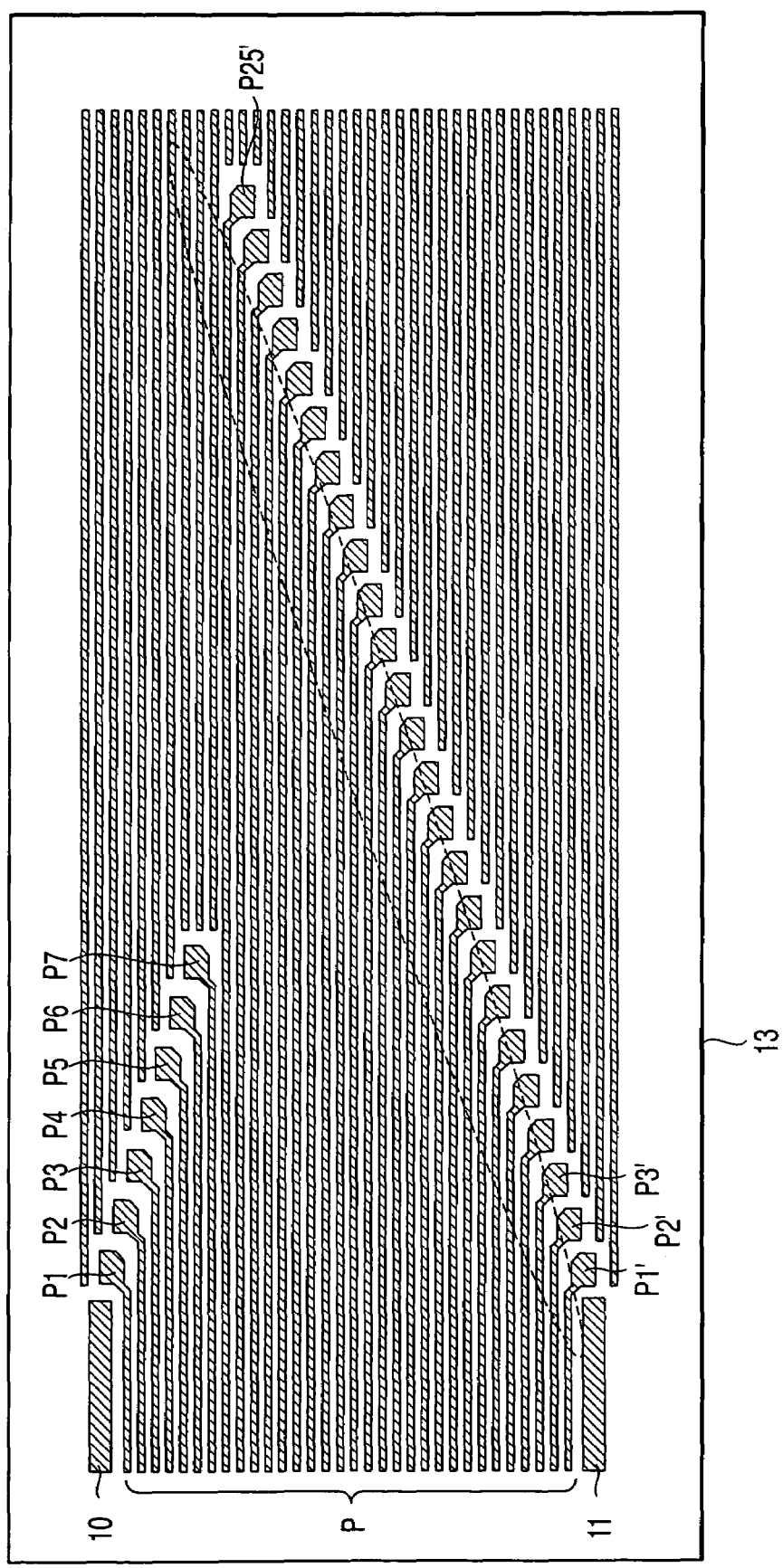
FIG. 2 is a plan view showing the layout of a CG wiring pattern for a NAND type flash memory according to an embodiment.

FIG. 2 is a plan view showing the CG wiring pattern layout according to the present embodiment. A circuit pattern group including select gates 10 and 11, and 32 pieces of CG wiring gate patterns P (P1 through P7, and P1' through P25') is arranged above a semiconductor substrate (wafer) 13.

The 32 pieces of CG wiring gate patterns P are arranged between the select gates 10 and 11 with a constant pitch. The pitch is not necessarily required to be constant. The 32 pieces of CG wiring gate patterns P have the same longitudinal direction, and each of the 32 pieces of CG wiring gate patterns P is arranged in a direction perpendicular to the longitudinal direction. In FIG. 2, only P1', P2', P3', P25' among the reference numerals P1'-P25' are illustrated for the sake of simplification.

With regard to the CG wiring patterns P1-P7 arranged under the select gate 10, a pattern arranged at lower position has the longer longitudinal dimension of the gate pattern section.

The longitudinal dimension of the gate pattern section of the CG wiring pattern P2 is longer than that of the gate pattern section of the CG wiring pattern P1 by a constant dimension. Similarly, the longitudinal dimension of the gate pattern section of the CG wiring pattern P3 is longer than that of the gate pattern section of the CG wiring pattern P2 by a constant dimension.

That is, the longitudinal dimension of the gate pattern section of the CG wiring pattern Pi (i=2 through 7) is longer than that of the gate pattern section of the CG wiring pattern Pi-1 by a constant dimension.

A difference (a constant dimension) between the longitudinal dimension of the gate pattern section of the CG wiring pattern Pi and that of the gate pattern section of the CG wiring pattern Pi-1 is not necessarily required to be the same among those of the patterns i.

The gate extraction section of the CG wiring pattern P1 is arranged above a part of the CG wiring pattern P2 which is longer than the CG wiring pattern P1 by the constant dimension. Similarly, the gate extraction section of the CG wiring pattern P2 is arranged above a part of the CG wiring pattern P3 which is longer than the CG wiring pattern P2 by the constant dimension.

That is, the gate extraction section of the CG wiring pattern Pi-1 is arranged above a part (in an open space) of the CG wiring pattern Pi which is longer than the CG wiring pattern Pi-1 by the constant dimension. Accordingly, the CG wiring patterns P1-P7 are arranged in such a way that the gate extraction section of the CG wiring pattern Pi-1 and that of the CG wiring pattern Pi do not overlap with regard to a direction in which the CG wiring patterns P are arranged.

On the other hand, With regard to the CG wiring patterns P1'-P25' arranged above the select gate 11, a pattern arranged at upper position has the longer longitudinal dimension of the gate pattern section.

The longitudinal dimension of the gate pattern section of the CG wiring pattern P2' is longer than that of the gate pattern section of the CG wiring pattern P1' by a constant dimension. Similarly, the longitudinal dimension of the gate pattern section of the CG wiring pattern P3' is longer than that of the gate pattern section of the CG wiring pattern P2' by a constant dimension.

That is, the longitudinal dimension of the gate pattern section of the CG wiring pattern Pj' (j=2 through 25) is longer than that of the gate pattern section of the CG wiring pattern Pj-1' by a constant dimension.

A difference (a constant dimension) between the longitudinal dimension of the gate pattern section of the CG wiring pattern Pj' and that of the gate pattern section of the CG wiring pattern Pj-1' is not necessarily required to be the same among those of the patterns j.

The gate extraction section of the CG wiring pattern P1' is arranged above a part of the CG wiring pattern P2' which is longer than the CG wiring pattern P1' by the constant dimension. Similarly, the gate extraction section of the CG wiring pattern P2' is arranged above a part of the CG wiring pattern P3' which is longer than the CG wiring pattern P2' by the constant dimension.

That is, the gate extraction section of the CG wiring pattern Pj-1' is arranged above a part (in an open space) of the CG wiring pattern Pj' which is longer than the CG wiring pattern Pj-1' by the constant dimension. Accordingly, the CG wiring patterns P1'-P25' are arranged in such a way that the gate extraction section of the CG wiring pattern Pj-1' and that of the CG wiring pattern Pj' do not overlap with regard to a direction in which the CG wiring patterns P are arranged.

The CG wiring pattern layout of the present embodiment comprises a pattern layout with an asymmetrical mountain shape, wherein the pattern layout includes seven gate extraction sections arranged from top to bottom, and 25 gate extraction sections arranged from bottom to top. The reason for adopting such a pattern layout will be described bellow.

Figure 3:
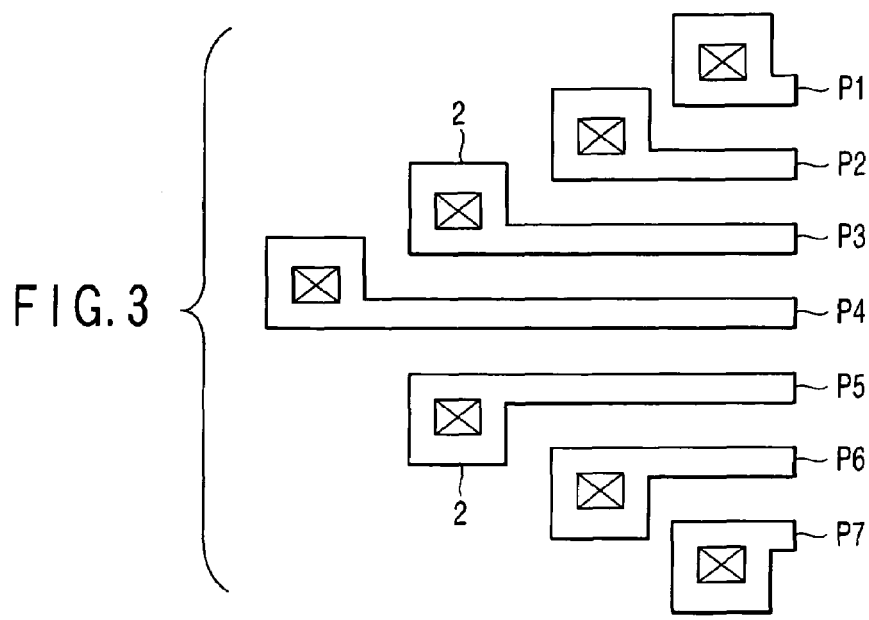
FIG. 3 is a plan view showing the layout of a CG wiring pattern with a symmetrical shape.

FIG. 3 shows a pattern layout with a symmetrical mountain shape, in which the number of the gate extraction sections arranged from top to bottom is the same as that of the gate extraction sections from bottom to top. That is, the drawing shows a CG wiring pattern layout comprises a plurality of gate extraction sections which are symmetrically arranged with respect to the CG wiring pattern layout P4 between the upper and lower portions.

The fringe 2 of the adjacent CG wiring patterns P3 is arranged above the extracting wiring section of the CG wiring pattern P4, and that of the adjacent CG wiring pattern P5 is arranged under the extracting wiring section of the CG wiring pattern P4. In this case, the lithography latitude is insufficient, so that a possibility of danger that a contacting between the extracting wiring section of the CG wiring pattern P4 and the fringes 2 of the CG wiring patterns P3, P5 may occurs.

Figure 4:
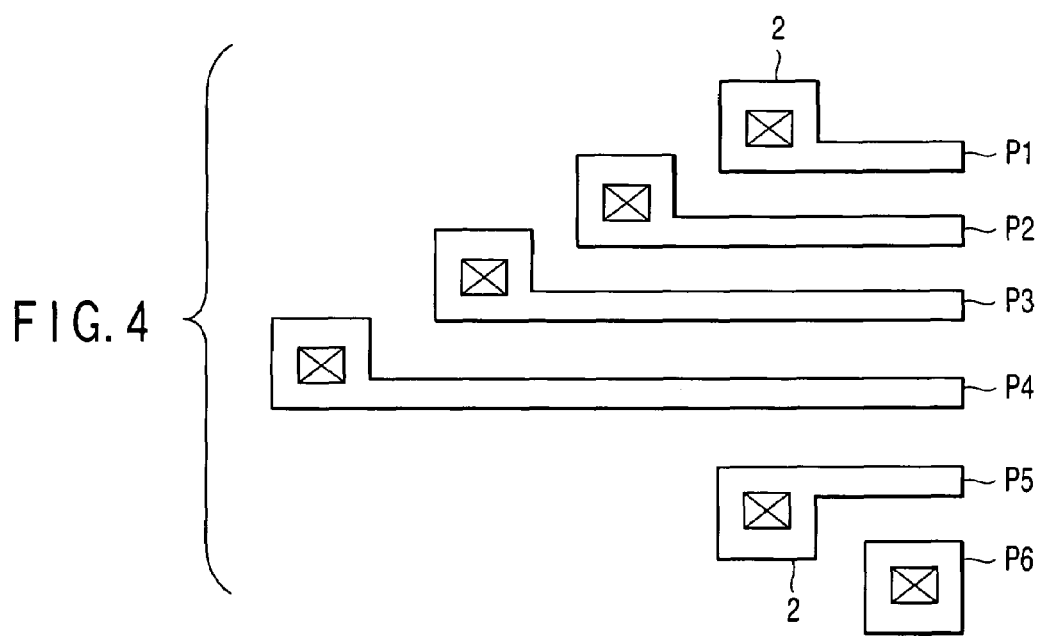
FIG. 4 is a plan view showing the layout of a CG wiring pattern with an asymmetrical shape according to the embodiment.

FIG. 4 shows a pattern layout with an asymmetrical mountain shape, in which the number of the gate extraction sections arranged from top to bottom is different from that of the gate extraction sections from bottom to top. This is equivalent to a simplification of the CG wiring pattern layout shown in FIG. 2.

The fringe 2 of the CG wiring pattern P1 is arranged above the extracting wiring section of the CG wiring pattern P2 which is adjacent to the CG wiring pattern P1. However, the fringe 2 of the CG wiring pattern P3 is not arranged under the extracting wiring section of the CG wiring pattern P2 which is adjacent to the CG wiring pattern P2. The fringe 2 of the CG wiring pattern P3 is not arranged above the extracting wiring section of the CG wiring pattern P3 which is adjacent to the CG wiring pattern P3, and the fringe 2 of the CG wiring pattern P5 is not arranged under the extracting wiring section of the CG wiring pattern P3 which is adjacent to the CG wiring pattern P5. The fringe 2 of the CG wiring pattern P5 is arranged under the extracting wiring section of the CG wiring pattern P4 which is adjacent to the CG wiring pattern P5. However, the fringe 2 of the CG wiring pattern P3 is not arranged above the extracting wiring section of the CG wiring pattern P4 which is adjacent to the CG wiring pattern P3. That is, the extracting wiring section of a CG wiring pattern is not inserted between the fringes of the adjacent CG wiring patterns which are located above and under the CG wiring pattern.

Figure 5:
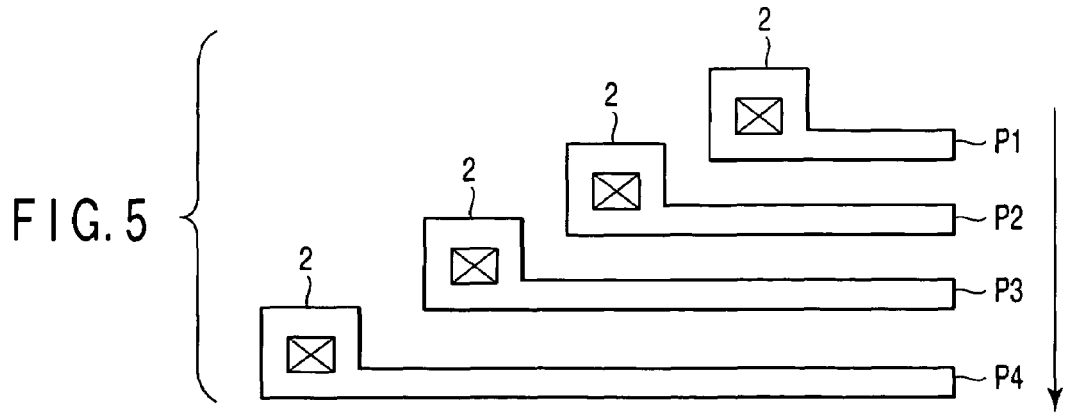
FIG. 5 is a plan view showing the layout of another CG wiring pattern with an asymmetrical shape according to the embodiment.

It is confirmed in the case of the CG wiring pattern layout shown in FIG. 4 that a required lithography latitude is secured. Similarly, it is confirmed, even in a case of a saw tooth shape layout of the CG wiring patterns for each of which the longitudinal dimension is monotonously increased to one direction as shown in FIG. 5, that required lithography latitude is secured.

Figure 6:
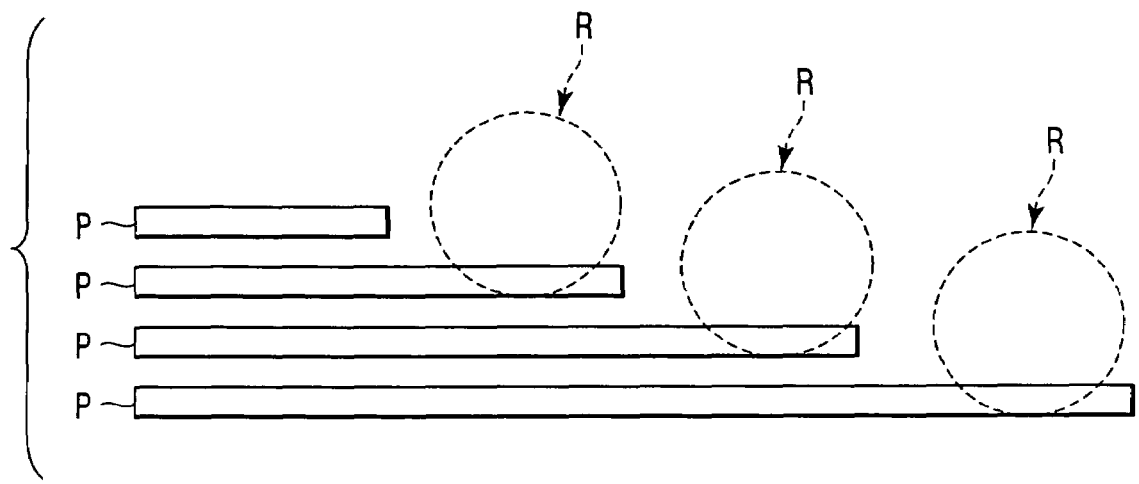
FIG. 6 is a view explaining a region in which a fringe according to the embodiment is arranged.

In the present embodiment, the fringes are arranged in regions R at the sides of the one end of the extraction sections of the CG wiring patterns P as shown in FIG. 6. Thereby, there is caused deviations from a periodic structure (symmetric structure) between the one end and the other one of the extraction section of a CG wiring pattern P. In this case, lithography latitude is decreased at both ends. When required lithography latitude cannot be secured by the above decreased latitude, a CG wiring pattern layout shown in FIG. 7 may be adopted.

Figure 7:
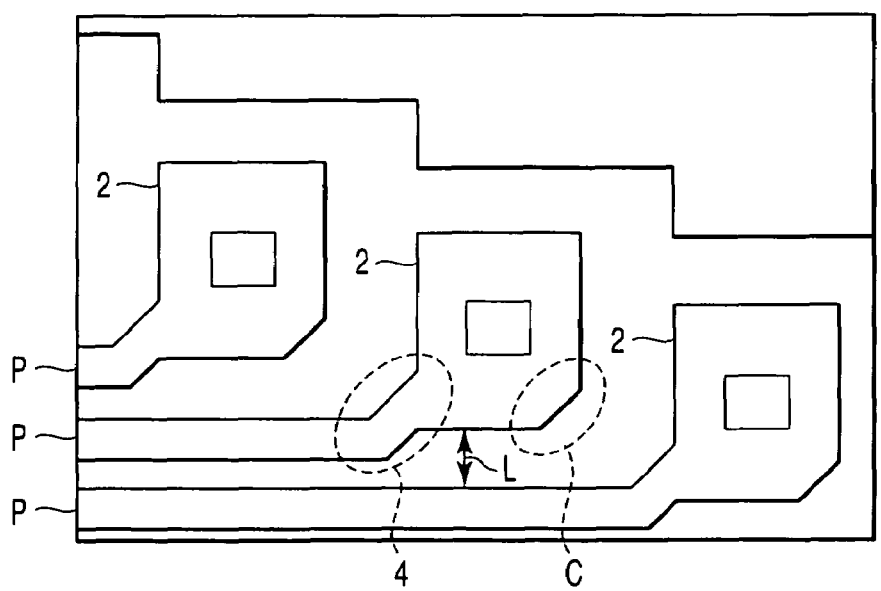
FIG. 7 is a plan view showing the layout of a CG wiring pattern in which reduction of a lithography margin is prevented according to the embodiment.

The CG wiring pattern layout in FIG. 7 is obtained by the following processing (1)-(3).

(1) A distance L between a fringe 2 and the adjacent CG wiring pattern P is widen;

(2) The fringe 2 and the CG wiring pattern are connected with a connection section 4 (extracting wiring section) including a slant pattern;

(3) The corner of the fringe 2 is put into slant shape. In FIG. 7, one corner C of the fringe 2 is in slant shape, however, a plurality of corners may be in slant shape.

The CG wiring pattern layout shown in FIG. 7 is applied a processing other than the described processing (1) to (3) which is not illustrated. Concretely, a processing for further adjusting the size of the fringe 2 by exposure conditions, a processing for changing wideness of the CG wiring pattern in the vicinity of the connection section 4 (extracting wiring section), and like that may be referred.

Not all the above processing is required to be applied, and processing to be applied can be selected in such a way that a required lithography latitude can be secured.

An example of a method for making the CG wiring pattern layout shown in FIG. 2 will be described below.

At first, the circuit pattern P1 and the circuit pattern P1', which are a reference for arrangement of 32 pieces of the CG wiring patterns P1-P7, and P1'-P25' in the CG wiring group, are defined. The CG wiring pattern P1 and the CG wiring pattern P1' have the same longitudinal direction, and the CG wiring pattern P1' is arranged under the CG wiring pattern P1 in one direction being different from the above described longitudinal direction. Each of 32 pieces of the CG wiring pattern P1-P7 and P1'-P25' includes a fringe which is electrically connected to a circuit pattern in a circuit pattern group being different from the above described CG wiring pattern group. The both of the above described CG wiring pattern groups and the circuit pattern groups are arranged in layers different form each other, respectively.

Next, the remaining circuit patterns except the CG wiring patterns P1 and P1' among the 32 pieces of the CG wiring patterns P1-P7 and P1'-P25' are arranged between the CG wiring patterns P1 and P1'. At this time, with regard to six pieces of the CG wiring patterns P2-P7 (Pi), a pattern with the larger number of i is arranged at the further position away from the CG wiring pattern P1, and, with regard to 24 pieces of the CG wiring patterns P2'-P25' (Pj'), a pattern with the larger number of j is arranged at the further position away from the CG wiring pattern P1', and at a position lower than that of the CG wiring pattern P7 (a position at a constant distance away from the CG wiring pattern P7).

Finally, the larger the number of i, the longitudinal dimension of the CG wiring patterns P2-P7 (Pi) is more enlarged, and the larger the number of j, the longitudinal dimension of the CG wiring patterns P2'-P25' is more enlarged, and the longitudinal dimension of the CG wiring patterns P25' is more enlarged than the longitudinal dimension of the CG wiring patterns P7.

In the present embodiment, the longitudinal dimension of the CG wiring pattern P25' is longer than that of the CG wiring pattern P7, however, to the contrary, the 32 pieces of the CG wiring patterns P1-P7, and P1'-P25' may be arranged in such a way that the longitudinal dimension of the CG wiring pattern P7 is longer than that of the CG wiring pattern P25'.

In general, the above described longitudinal dimensions for the larger number of the CG wiring patterns are longer than those of the smaller number of the CG wiring patterns when the number of the CG wiring patterns arranged from the top (seven here) and the number of the CG wiring patterns arranged from the bottom (25 here) are compared. In a case where the size of fringe for the larger number of the CG wiring patterns can be smaller than that of the smaller number of the CG wiring patterns, a magnitude relation of the longitudinal dimensions may be reversed. Especially, when a difference between the number of the CG wiring patterns arranged from the top and that of the CG wiring patterns arranged from the bottom is small, the magnitude relation of the longitudinal dimensions can be easily reversed.

Moreover, here, the 32 pieces of the CG wiring patterns are divided into seven pieces (number of CG wiring patterns arranged from top) and 25 pieces (number of CG wiring patterns arranged from bottom) to make the pattern layout with an asymmetrical mountain shape, however, in a case where the 32 pieces of the CG wiring patterns are divided into one piece and 31 pieces, the number of CG wiring patterns arranged from the bottom becomes zero. That is, the circuit pattern P1' to be a reference is defined, but there is no CG wiring pattern arranged from the circuit pattern P1' to top.

Next, an example of a method for making the CG wiring pattern layout shown in FIG. 5 will be described below.

At first, the circuit pattern P1, which is a reference for arrangement of four pieces of the CG wiring patterns P1-P4 in the CG wiring group, is defined. Each of the four CG wiring patterns P1-P4 includes a fringe 2 for electrical connection to a circuit pattern in a wiring group being different from the above described CG wiring pattern group. The both of the above described CG wiring pattern groups and the circuit pattern groups are arranged in layers different form each other, respectively.

Next, three pieces of the CG wiring patterns Ni (i=2, 3, 4) are arranged in one direction being different from the longitudinal direction of the CG wiring pattern P1. At this time, with regard to three pieces of the CG wiring patterns Ni, a pattern with the larger number of i is arranged at the further position away from the CG wiring pattern N1.

Finally, the larger the number of i, the longitudinal dimension of the three CG wiring patterns Ni is more enlarged, Incidentally, the contrast of light intensity for the gate pattern section and the fringe can be improved by arranging a dummy pattern in the space portion of the gate pattern section. This is illustrated in FIG. 8 showing an experiment result (distribution of light intensity).

Figure 8:
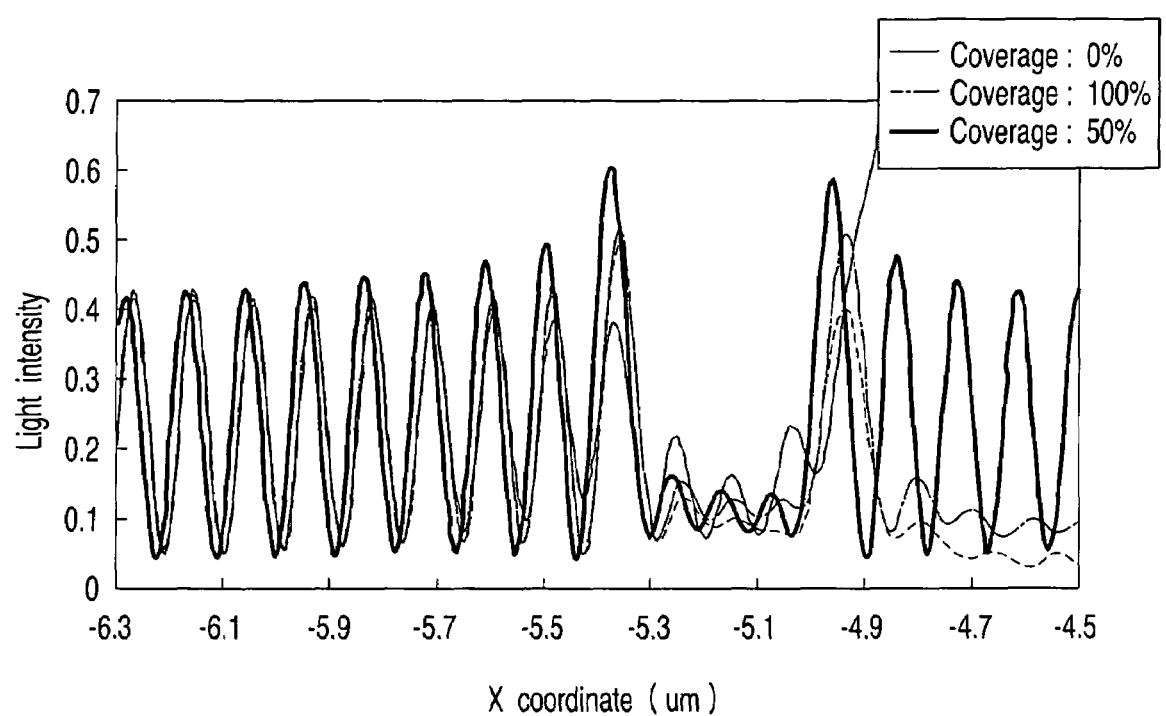
FIG. 8 is a view showing a distribution of light intensity for explaining an effect of a dummy pattern.

FIG. 8 shows the dependence of the light intensity distribution on position for three CG wiring pattern layouts, that is, one with no dummy pattern (coverage: 0%), one with a dummy pattern (coverage: 50%), and one with a dummy pattern (coverage: 100%).

The light intensity distributions of the CG wiring pattern layouts is acquired by applying PPC to the CG wiring pattern layout, performing an optical image calculation using mask data of the CG wiring pattern layouts to which the PPC is applied, and calculating the light intensity distributions on a wafer based on result of the above described optical image calculation.

Figure 9A:
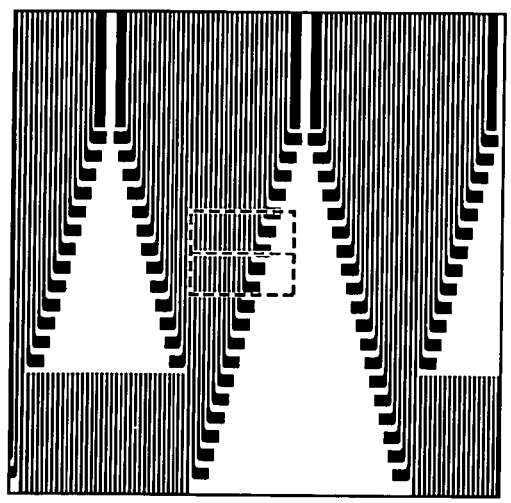
FIGS. 9A-9C are plan views showing a layout of a CG wiring pattern including dummy pattern and a layout of a CG wiring pattern including no dummy pattern.
Figure 9B:
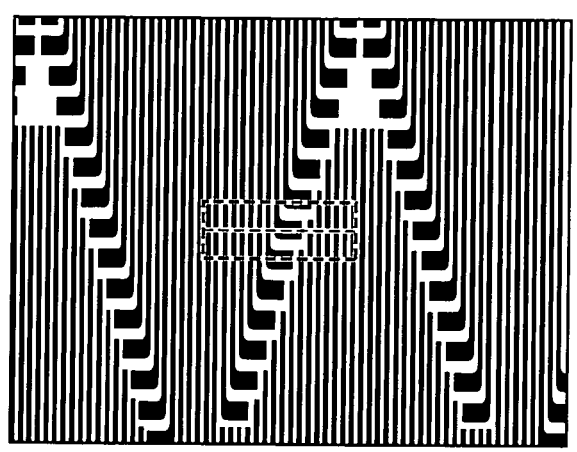
Figure 9C:
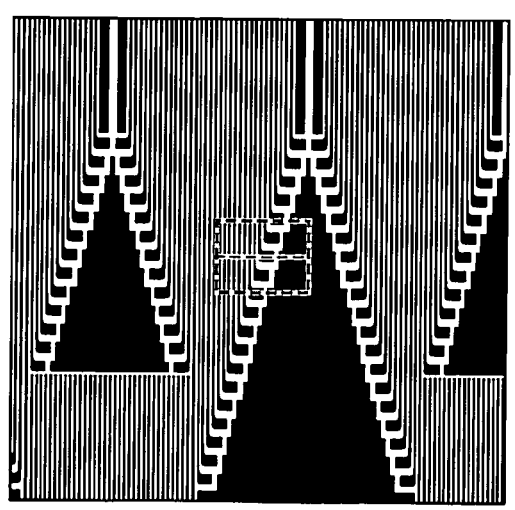
Figure 10A:
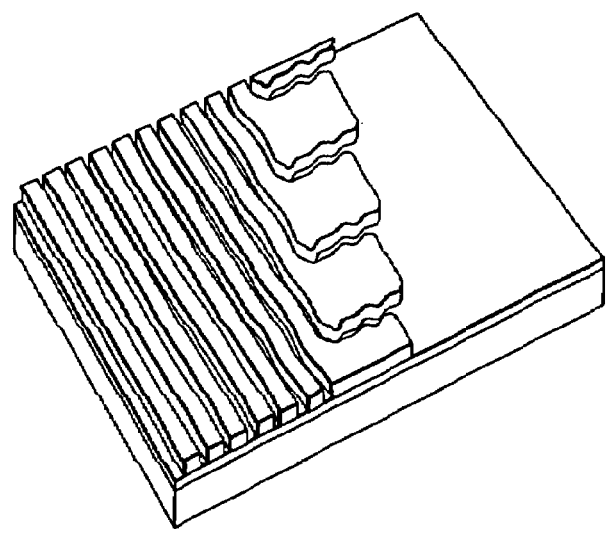
FIGS. 10A-10C are plan views showing a layout of a CG wiring pattern including dummy pattern and a layout of a CG wiring pattern including no dummy pattern.
Figure 10B:
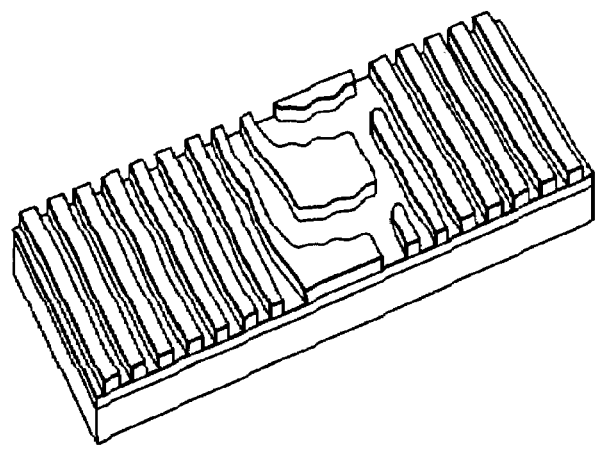
Figure 10C:
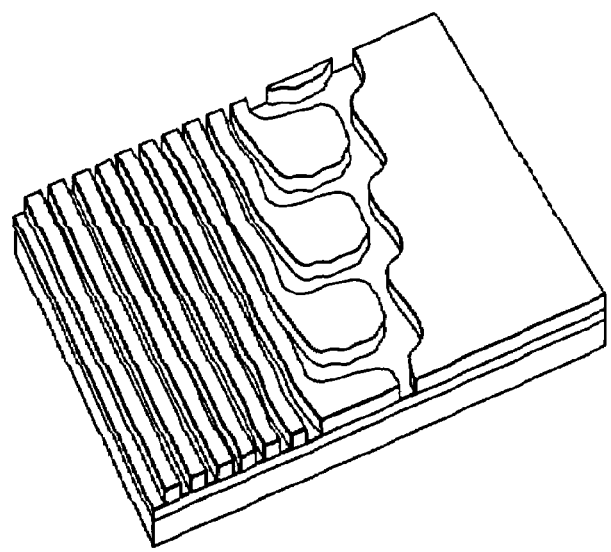

FIGS. 9A-9C show three types of plan views of the CG wiring pattern layouts with no dummy pattern (coverage: 0%), a dummy pattern (coverage: 50%), and a dummy pattern (coverage: 100%). FIGS. 10A-10C are three dimensional perspective views of the CG wiring pattern layouts shown in FIGS. 9A-9C.

The light intensity distributions of FIG. 8 indicates light intensities on thin dashed lines extending in the horizontal direction (X direction) in regions (regions including the vicinity of the fringe) enclosed with thick dashed lines in FIGS. 9A-9C.

It is found from FIG. 8 that the contrast of light intensity for the gate pattern section and the fringe is further improved in the CG wiring pattern layouts, in the order, one with no dummy pattern (coverage: 0%), one with a dummy pattern (coverage: 100%), and one with a dummy pattern (coverage: 50%). That is, it is confirmed that a higher contrast is obtained by arranging an L&S pattern (dummy pattern) with a similar degree of a period to that of the gate pattern section in the space portion of the gate pattern section, especially, the highest contrast is obtained by arranging the dummy pattern with coverage of 50%.

It is beneficial to arrange a fine dummy pattern (L&S pattern with a similar degree of a period to that of the gate pattern section) only in a required location and to arrange a large dummy pattern (large scale dummy pattern) in other locations in order to reduce electron beam (EB) exposure time for forming a reticle. The large scale dummy pattern includes a pattern defined by a larger dimension than the space width (line width) of the above described L&S pattern.

Each of FIGS. 11-20 shows a plan view of another CG wiring pattern layout in the present embodiment.

Figure 11:
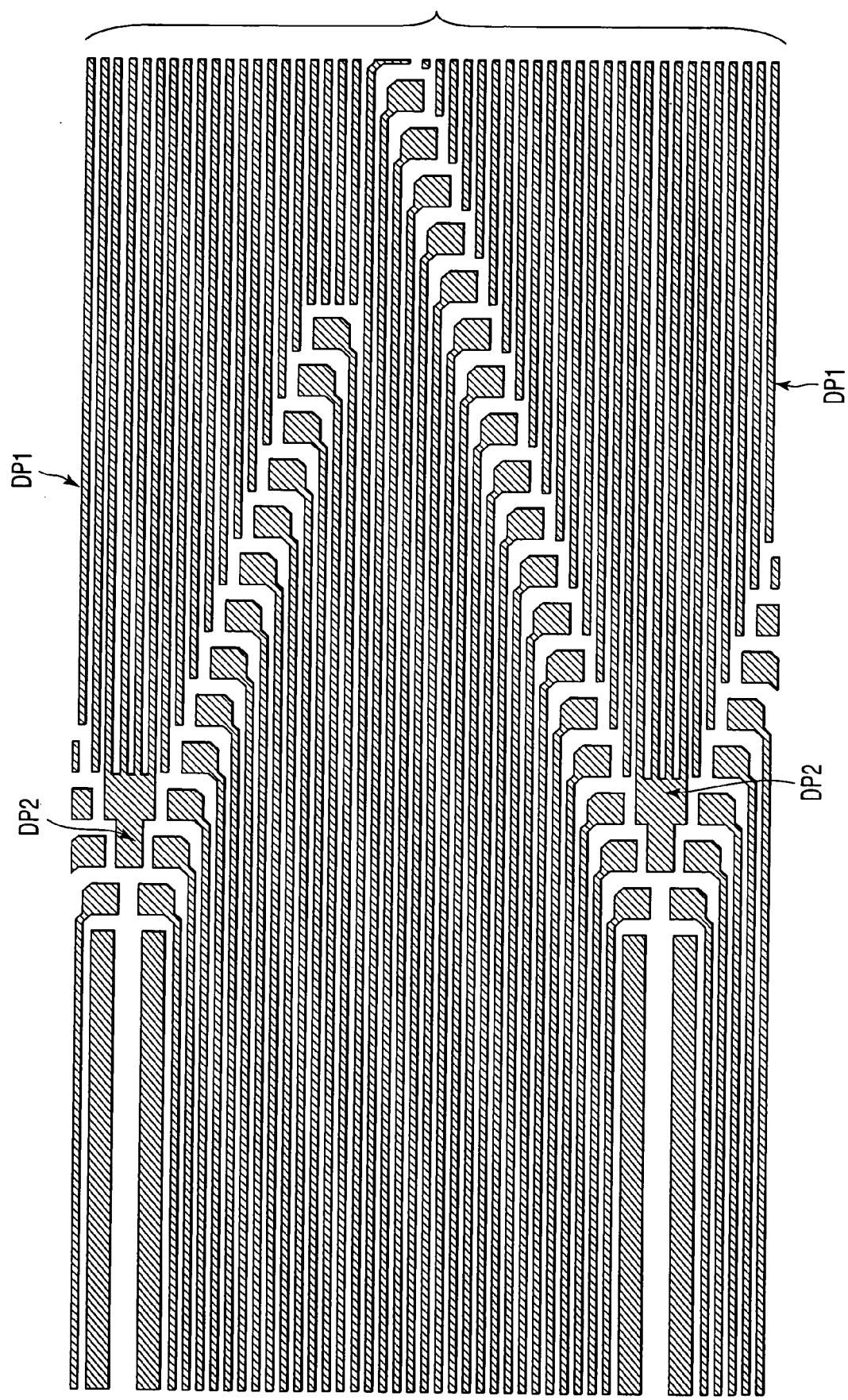
FIG. 11 is a plan view showing a layout of another CG wiring pattern according to the embodiment.

FIG. 11 shows a CG wiring pattern layout including dummy patterns (PPC subject dummy patterns) DP1 to which PPC is applied, and dummy patterns (not PPC subject dummy patterns) DP2 to which PPC is not applied. The example of FIG. 11 does not set limitations on dummy patterns for the not PPC subject dummy pattern DP2.

Figure 12:
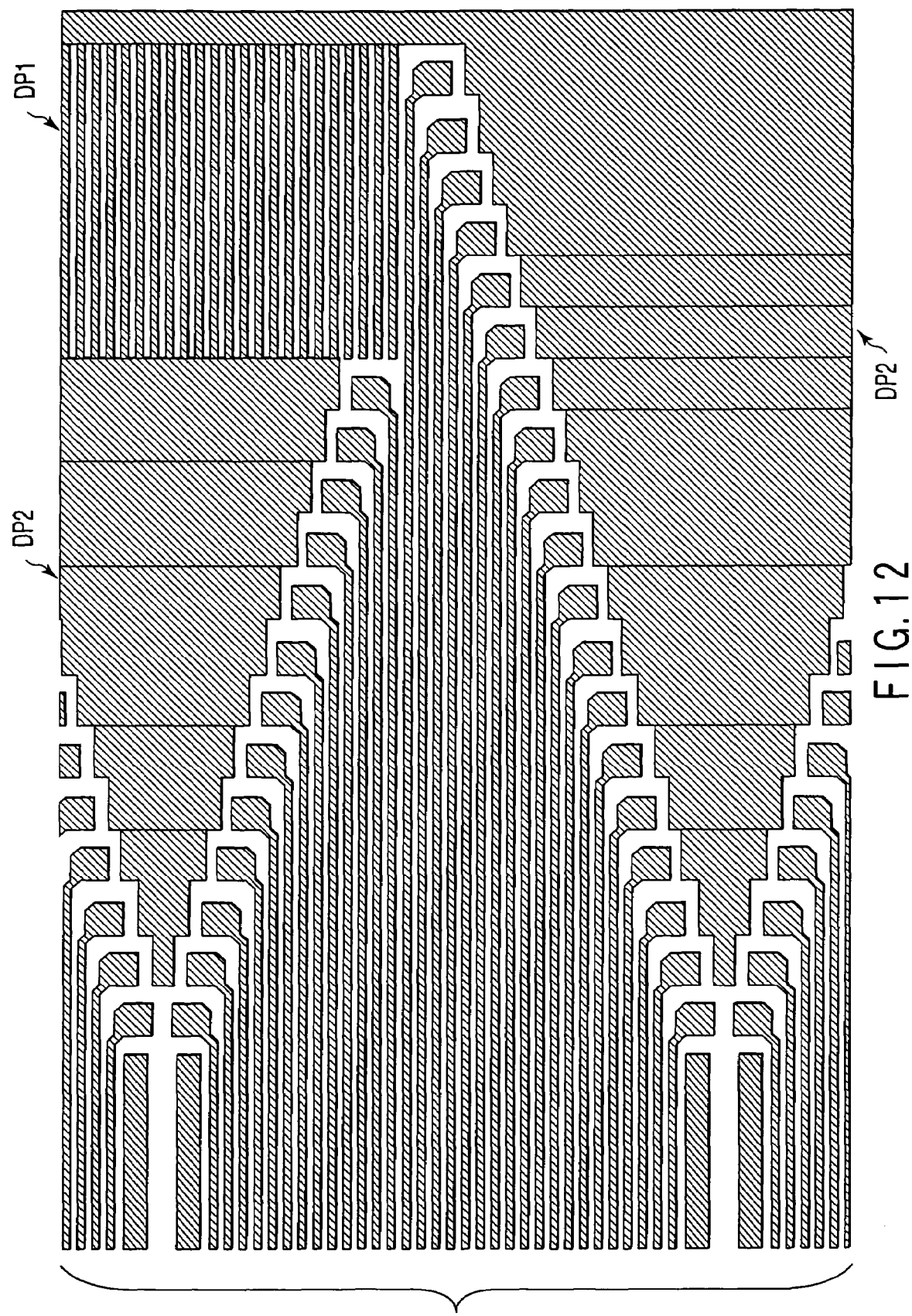
FIG. 12 is a plan view showing a layout of another CG wiring pattern according to the embodiment.

FIG. 12 shows a CG wiring pattern layout including PPC subject dummy patterns DP1, and not PPC subject dummy patterns DP2'. Dummy pattern for the not PPC subject dummy pattern DP2' include a large scale dummy pattern. Time required for PPC processing can be reduced because PPC is not applied to the large scale dummy pattern. When MDP is executed, time required for MDP processing can be reduced because MDP is not applied to the large scale dummy pattern.

Figure 13:
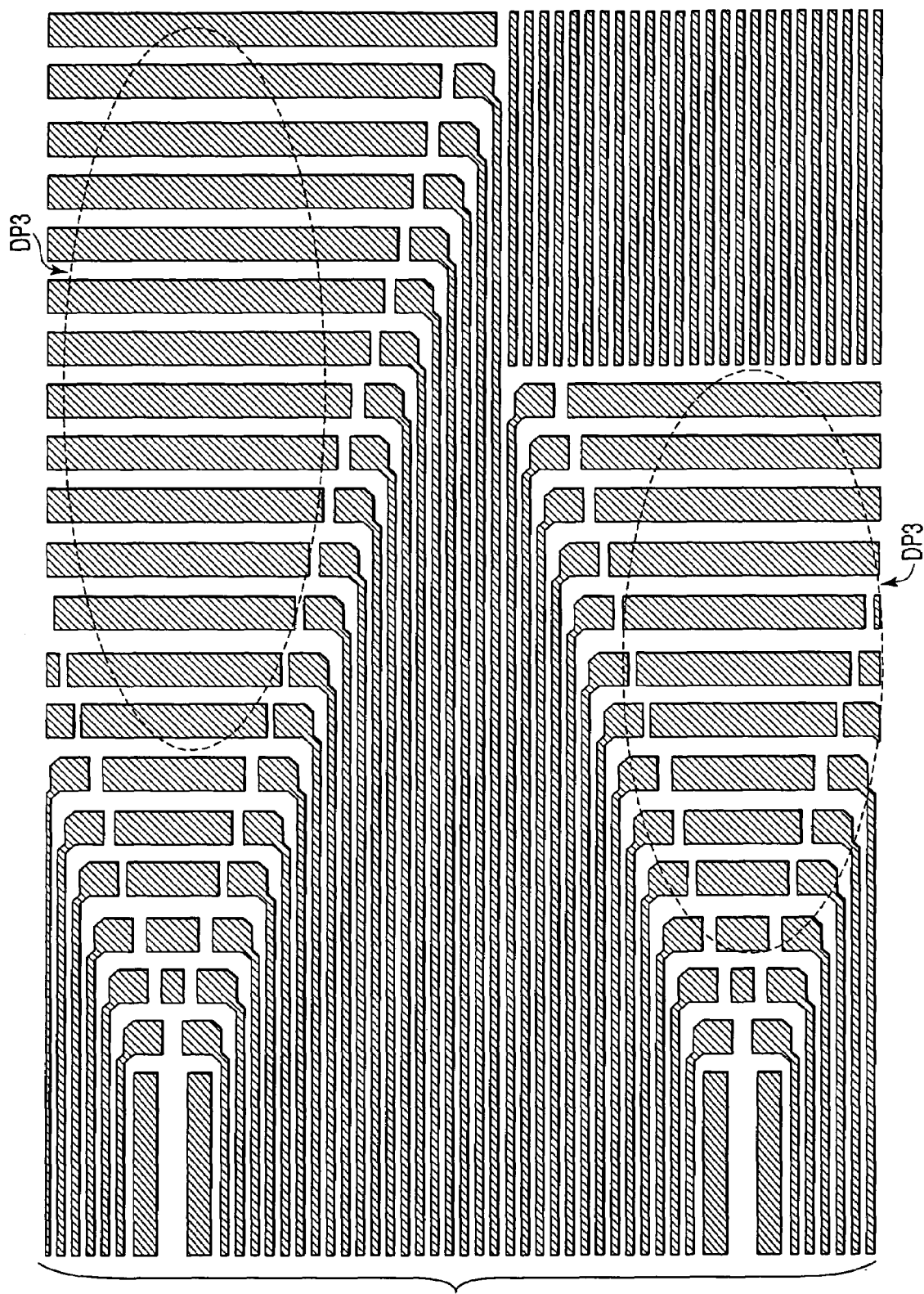
FIG. 13 is a plan view showing a layout of another CG wiring pattern according to the embodiment.

FIG. 13 shows a CG wiring pattern layout including strip shaped dummy patterns DP3.

Figure 14:
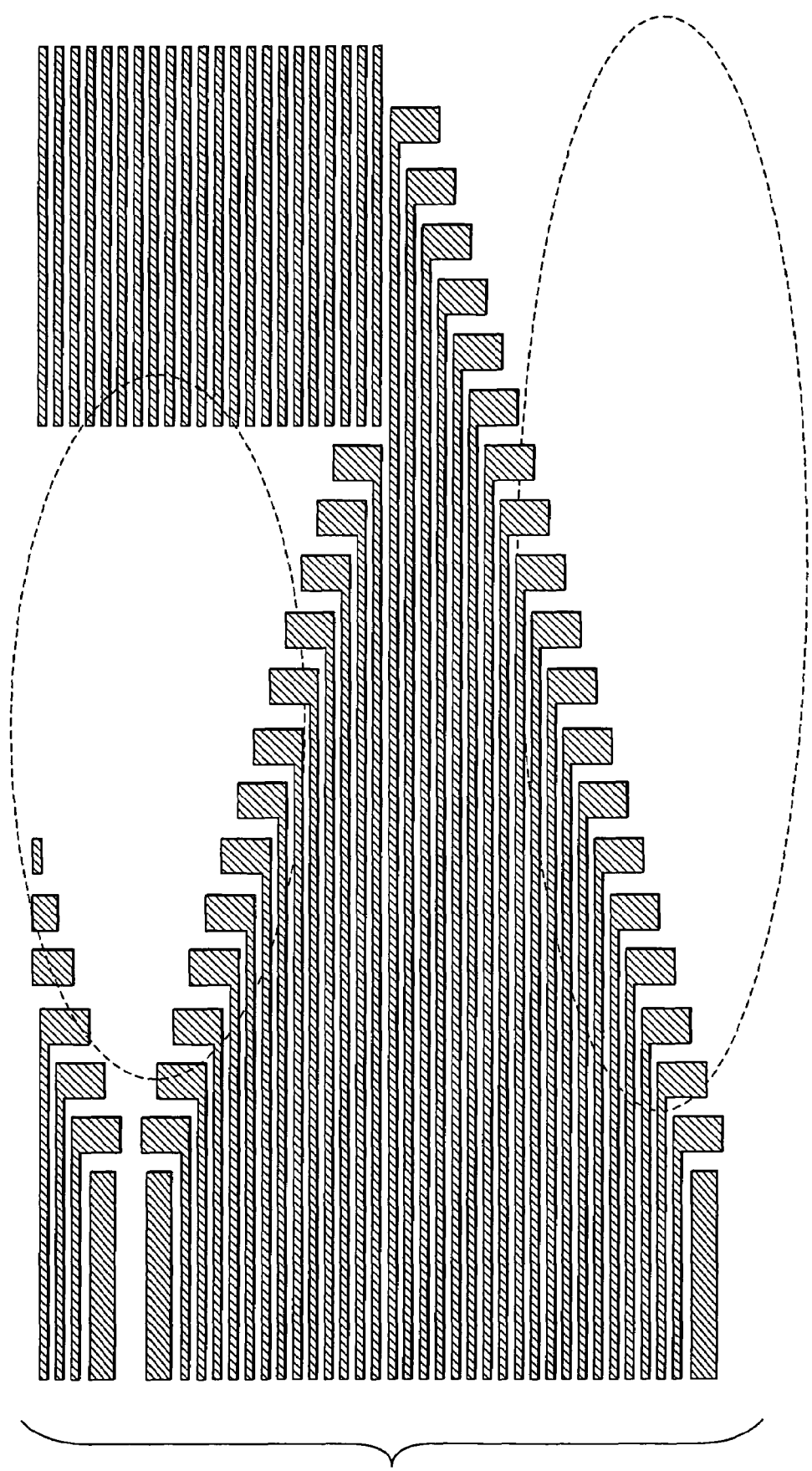
FIG. 14 is a plan view showing a layout of another CG wiring pattern according to the embodiment.

FIG. 14 shows another CG wiring pattern layout including no dummy pattern.

Figure 15:
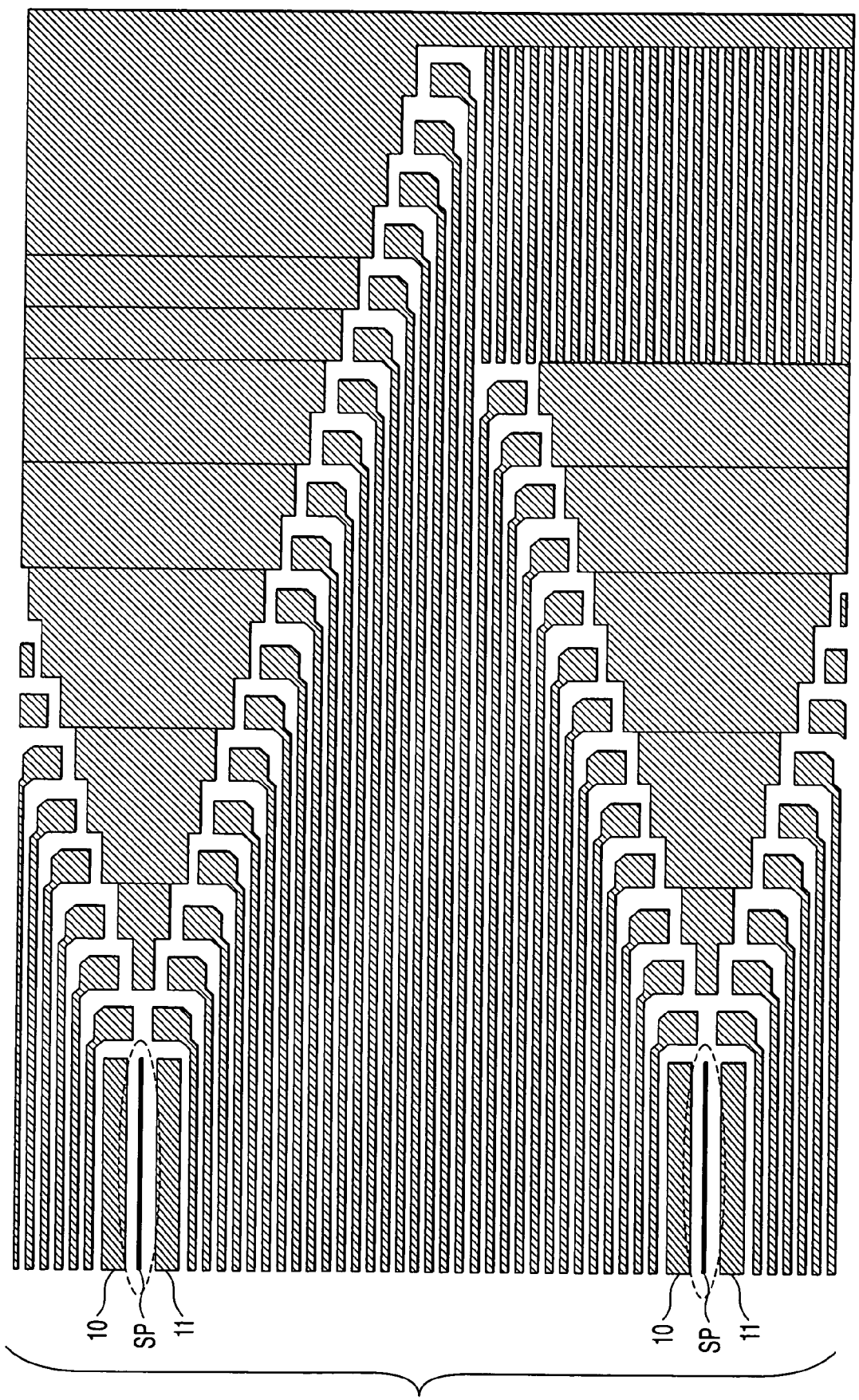
FIG. 15 is a plan view showing a layout of another CG wiring pattern according to the embodiment.

FIG. 15 shows another CG wiring pattern layout including patterns (supplementary patterns) SP for a sub resolution assist feature (SRAF), wherein the patterns are arranged between the select gates 10 and 11. Though the CG wiring pattern layout shown in FIG. 15 is a layout on a photo mask, or the CG wiring pattern layout in other examples may be a layout on a wafer.

Figure 16:
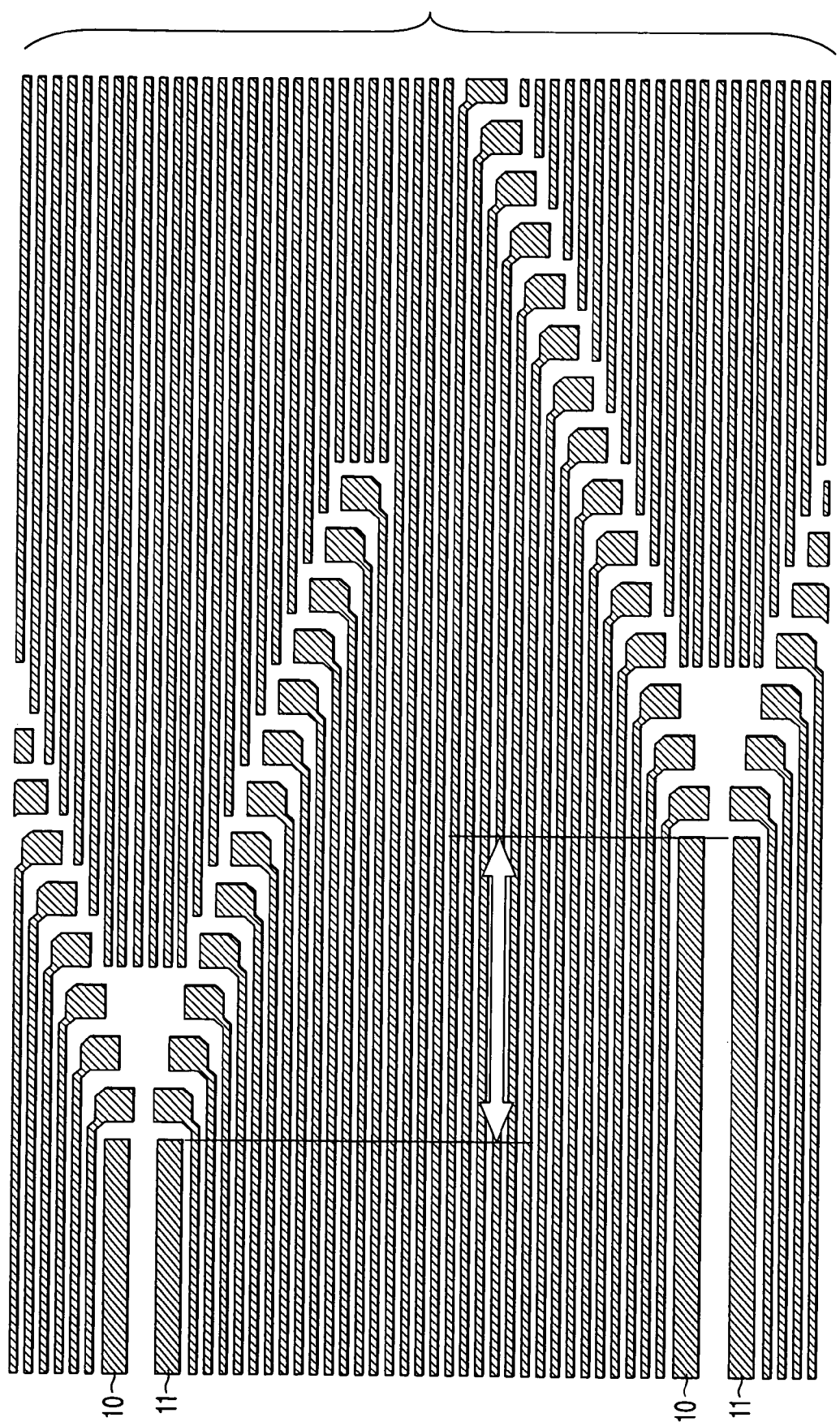
FIG. 16 is a plan view showing a layout of another CG wiring pattern according to the embodiment.

FIG. 16 shows a CG wiring pattern layout in which the ends of the select gates 10 and 11 are shifted in the longitudinal direction of the gate pattern sections of the CG wiring patterns.

Figure 17:
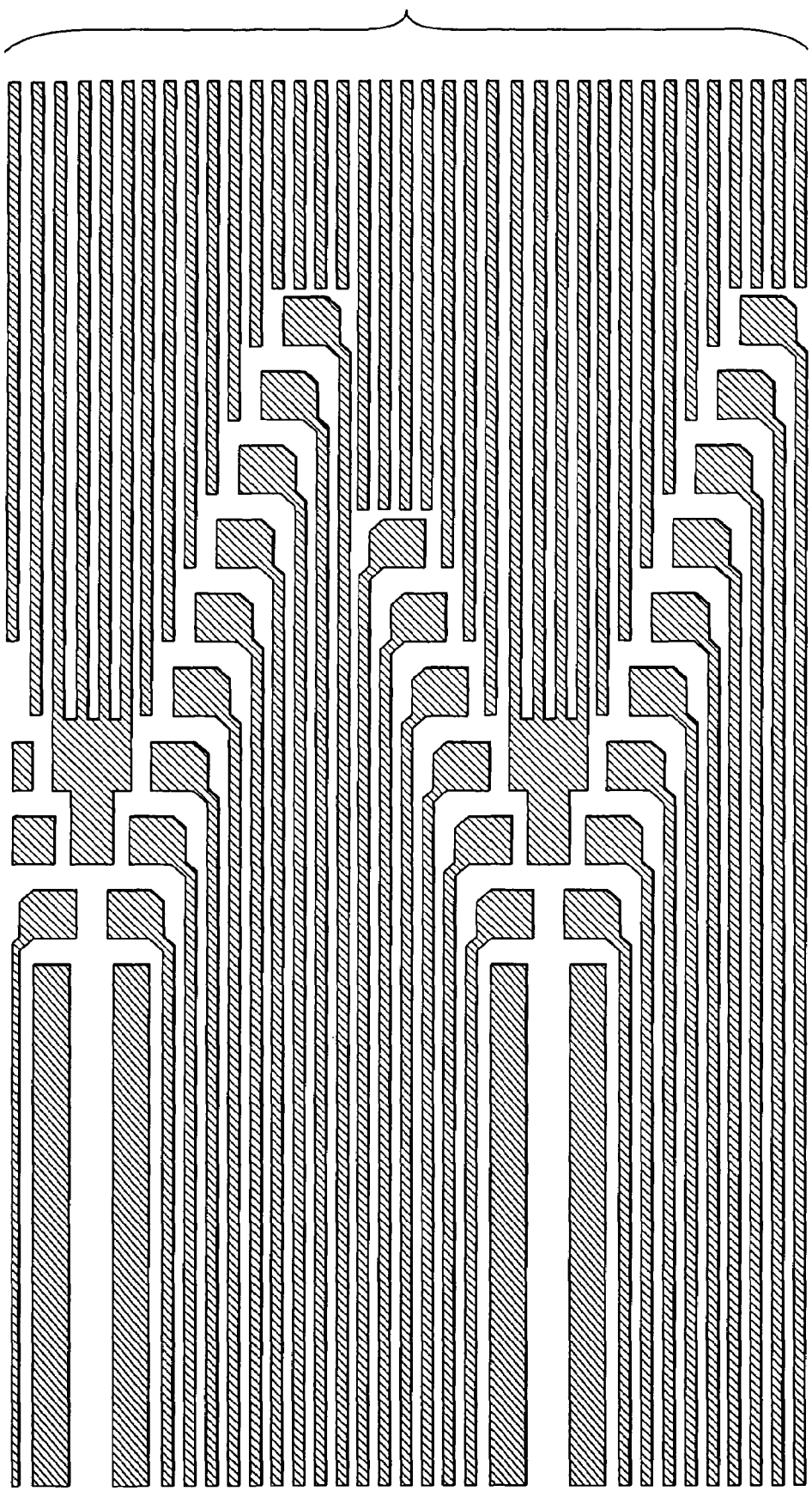
FIG. 17 is a plan view showing a layout of another CG wiring pattern according to the embodiment.

FIG. 17 shows a CG wiring pattern layout in which 15 pieces of CG wiring patterns are periodically arranged. Furthermore, a CG wiring pattern layout in which 16, 64 or 32 (integral multiples of 16 or 32) pieces of CG wiring patterns are periodically arranged may be adopted. Moreover, a CG wiring pattern layout in which eight pieces of CG wiring patterns are periodically arranged may be adopted. That is, there are no special limitations on the number of the CG wiring patterns.

Figure 18:
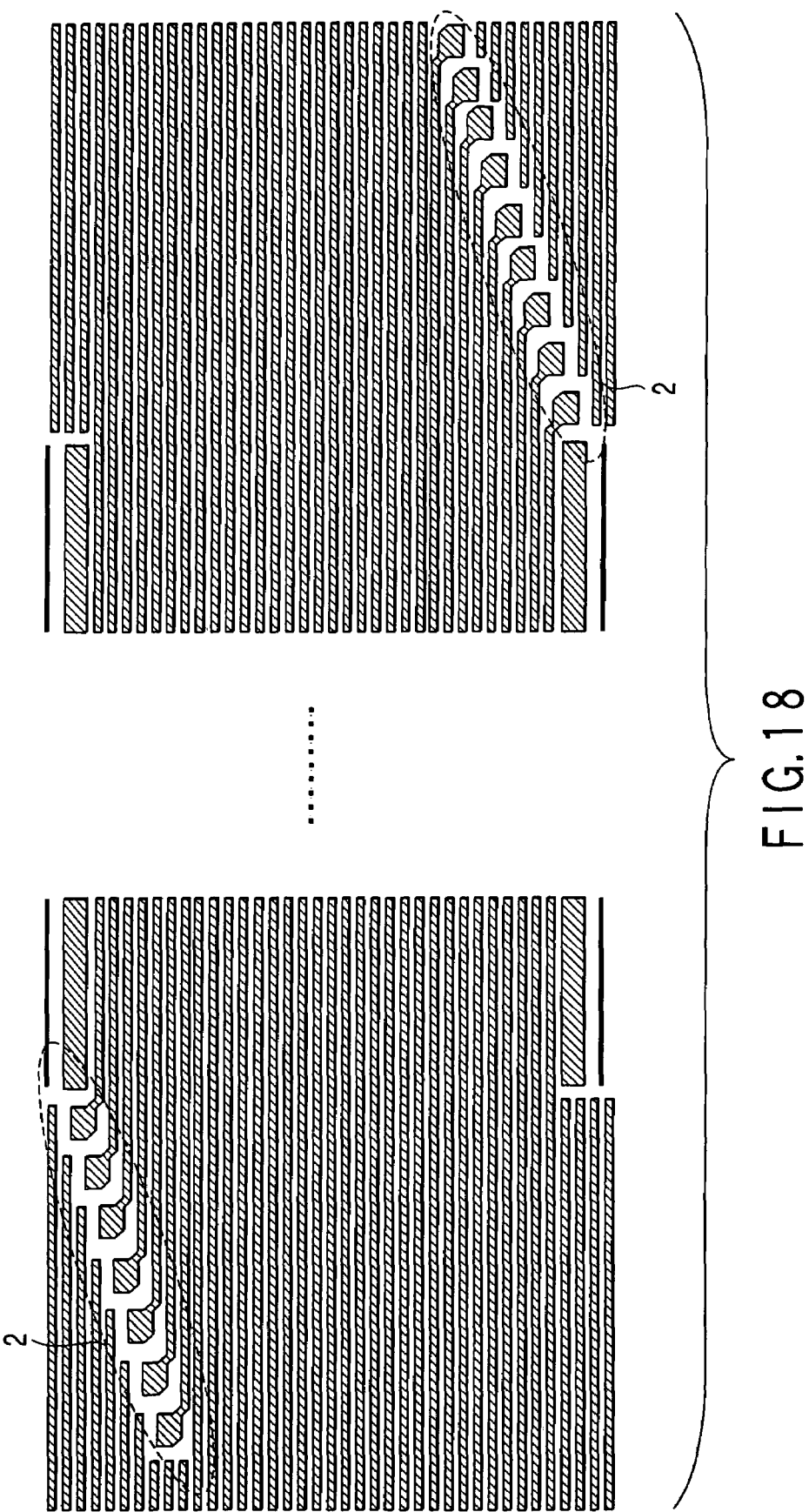
FIG. 18 is a plan view showing a layout of another CG wiring pattern according to the embodiment.

FIG. 18 shows a CG wiring pattern layout in which a fringe 2 is divided into two portions for arrangement.

Figure 19:
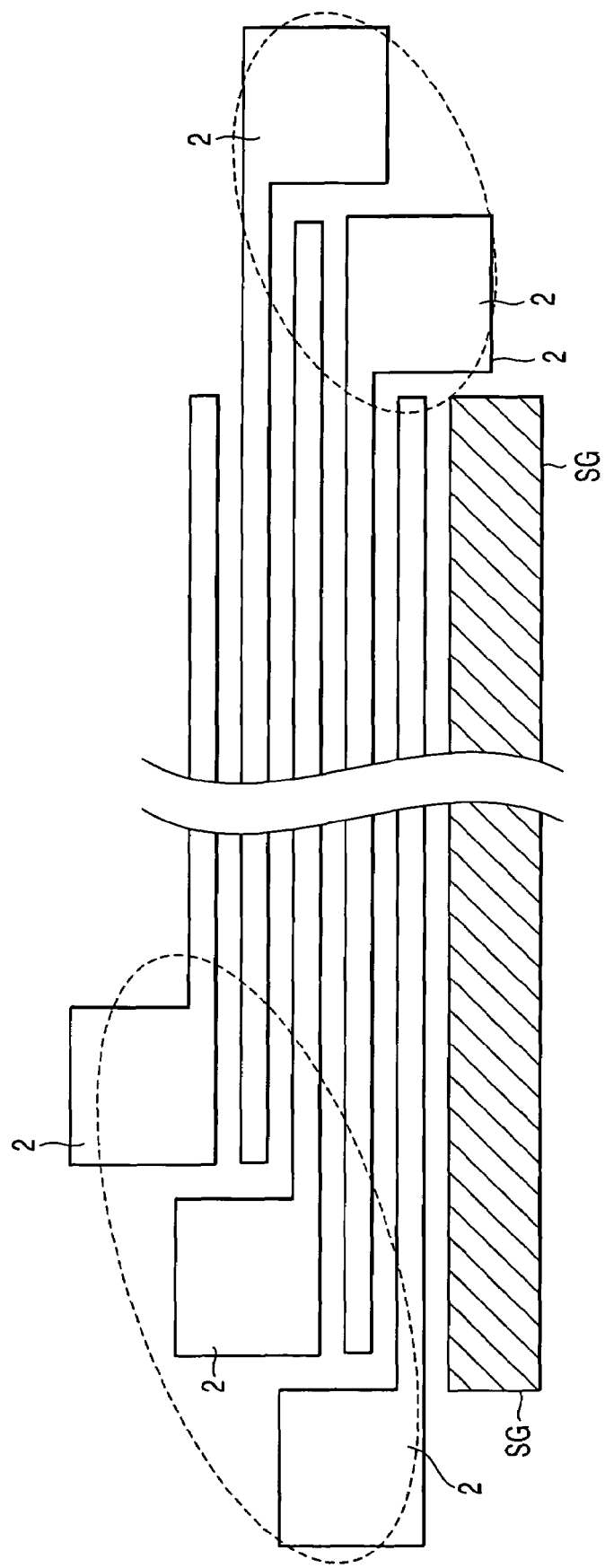
FIG. 19 is a plan view showing a layout of another CG wiring pattern according to the embodiment.

FIG. 19 shows a CG wiring pattern layout in which gate extraction sections (fringes 2) are alternately arranged at the right end portion or left end portion of CG wiring patterns. Though the gate extraction sections (fringes 2) are arranged at the right or left side every other CG wiring in FIG. 19, the gate extraction sections (fringes 2) may be arranged at the right or left side every three or more pieces of CG wiring.

Figure 20:
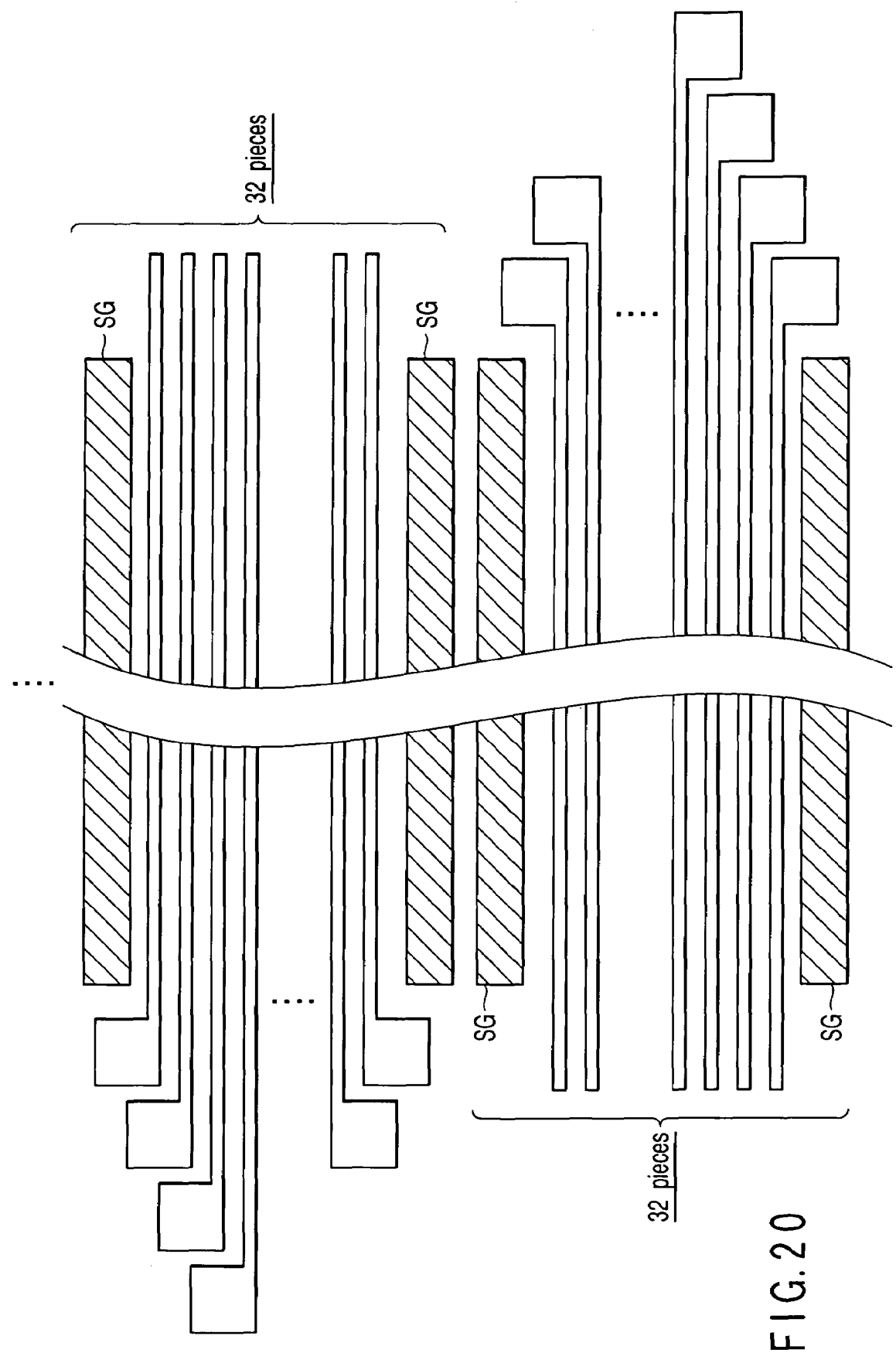
FIG. 20 is a plan view showing a layout of another CG wiring pattern according to the embodiment.

FIG. 20 shows a CG wiring pattern layout in which the gate extraction sections (fringes 2) are alternately arranged at the right or left side in one block. Two or more blocks may be a unit. The number of the CG wiring patterns in one block may be a number other than 32.

FIG. 37 shows a CG wiring pattern layout in which fringes 2 is not used and a short to a lower layer is prevented by control of processing of a hole (processing the hole not to reach the lower layer).

Figure 21:
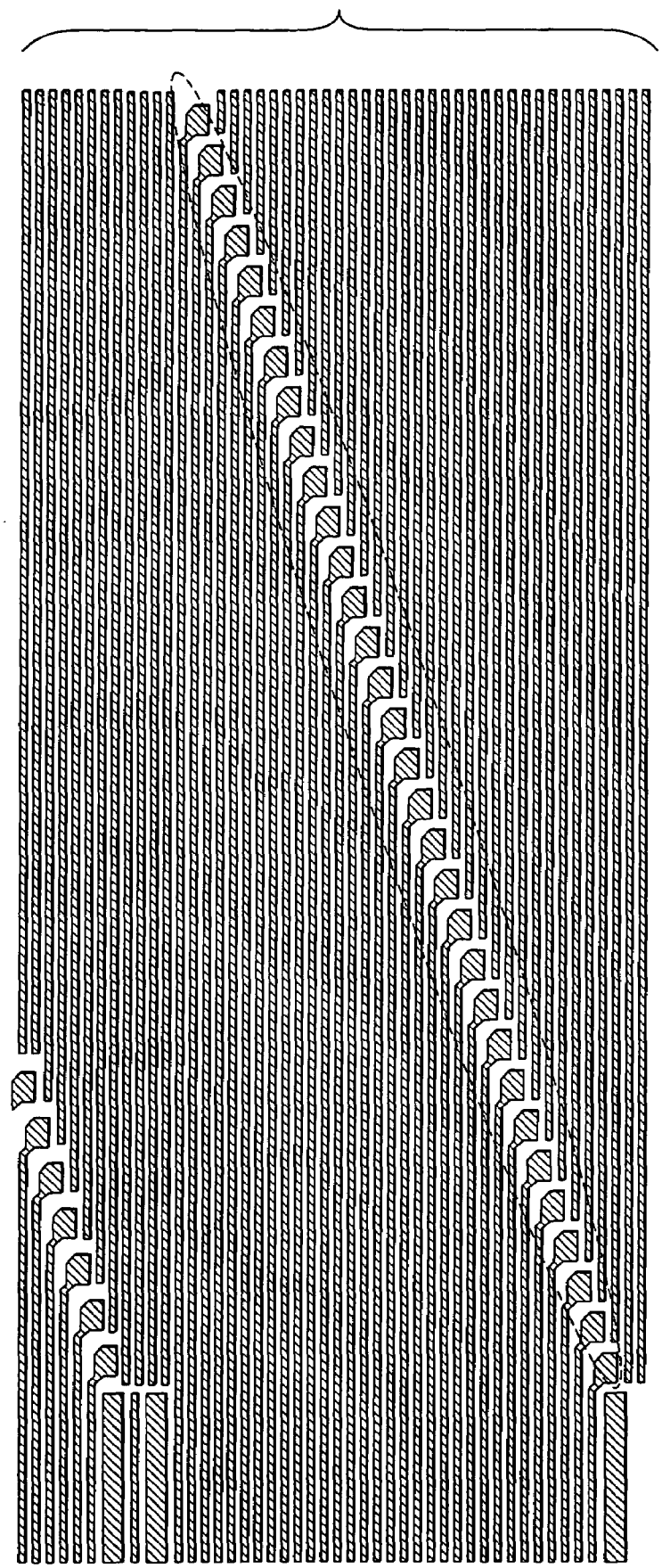
FIG. 21 is a plan view showing a layout of another CG wiring pattern according to the embodiment.

FIG. 21 shows a saw tooth shape layout of the CG wiring patterns for detailed illustration of the saw tooth shape layout of the CG wiring patterns shown in FIG. 4.

Figure 22:
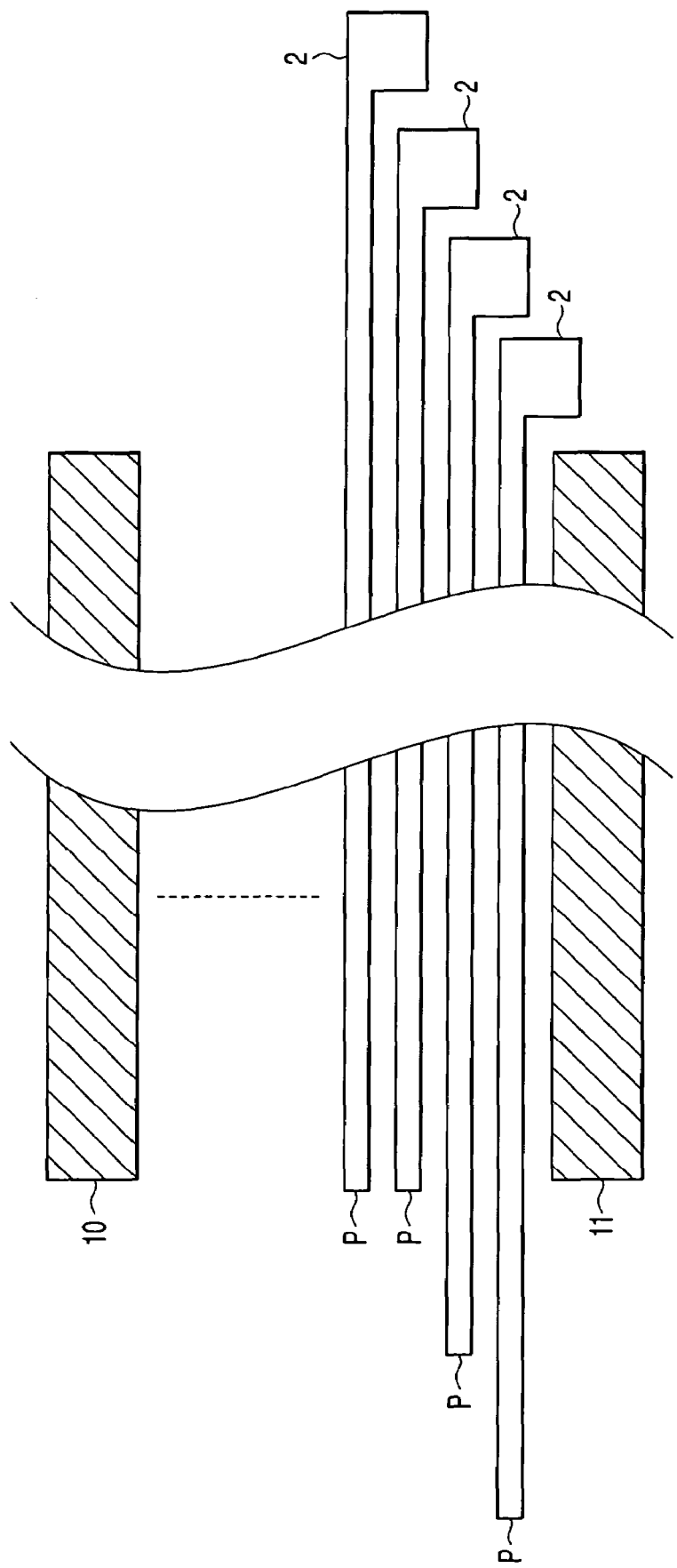
FIG. 22 is a plan view showing a layout of another CG wiring pattern according to the embodiment.

FIG. 22 shows a variation of the CG wiring pattern layout shown in FIG. 5. In FIG. 5, the end portions at an opposed location to the fringes 2 of the plurality of CG wiring patterns are arranged in order, however, in FIG. 22, opposite end portions corresponding to those in FIG. 5 are not arranged in order. That is, when only the fringes 2 are considered, a CG wiring pattern P arranged at the further position away from the reference CG wiring pattern has the longer longitudinal dimension.

Figure 23:
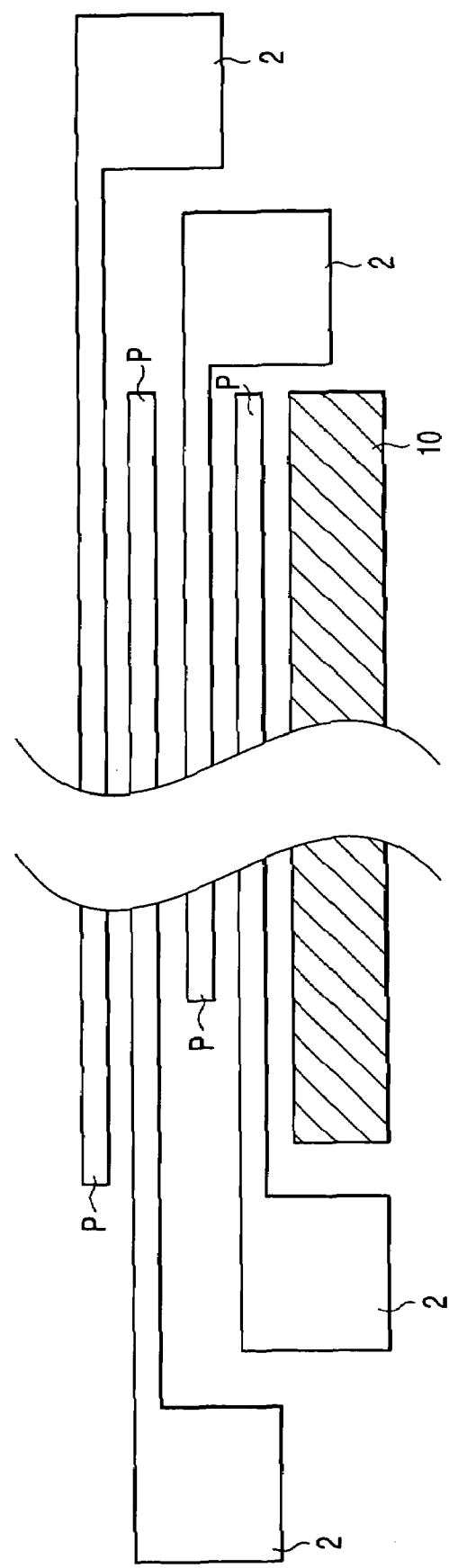
FIG. 23 is a plan view showing a layout of another CG wiring pattern according to the embodiment.

FIG. 23 shows another variation of the CG wiring pattern layout shown in FIG. 5. In FIG. 5, all the fringes 2 of the plurality of CG wiring patterns are arranged on the same side (left side). However, the fringes 2 of the plurality of CG wiring patterns are alternately arranged in the right or left side in FIG. 23. Moreover, when only the plurality of the CG wiring patterns whose fringes 2 are arranged on the same side are considered, the fringe 2 of a CG wiring pattern P located at the further position away from the reference CG wiring pattern is arranged at the further position in the longitudinal direction of the wiring in the same manner as that of FIG. 22. Though the fringes 2 are alternately arranged in the right or left side in FIG. 23, the fringes may be arranged in the right side or left one every three or more fringes, or a configuration in which the fringes are arranged every other fringe, and a configuration in which the fringes are arranged every three fringes may be mixed.

In the above explanation, kind of the modified illumination is not been referred, but, either of two pole illumination or four pole illumination may be adopted. That is, the layout of the present embodiment is effective regardless of the kind of the modified illumination.

Figure 24A:
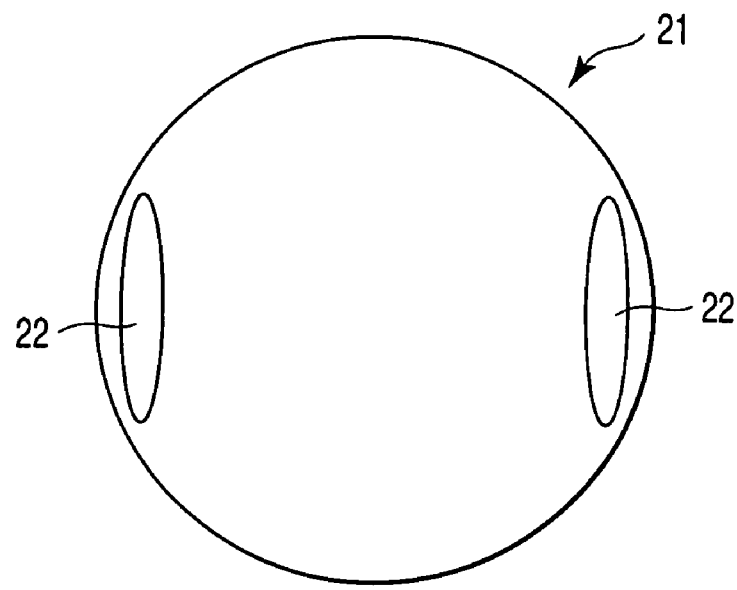
FIGS. 24A and 24B are plan views each showing an illumination shape for modified illumination.
Figure 24B:
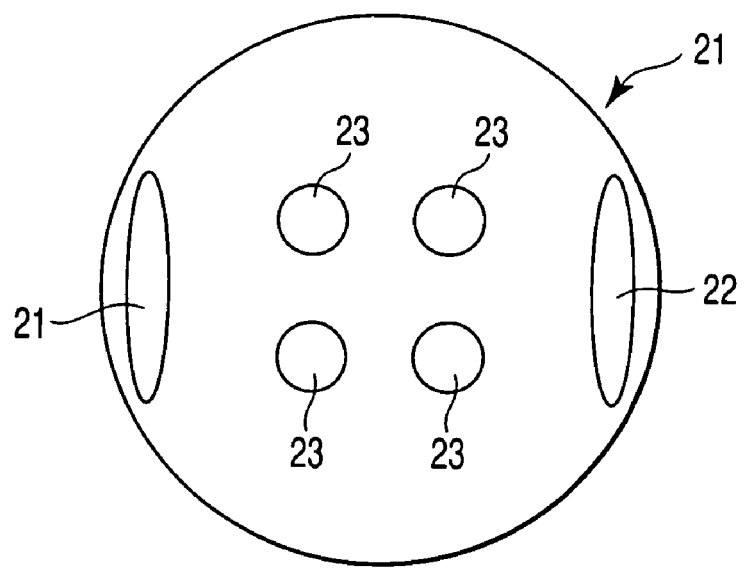

FIGS. 24A and 24B each show examples of the modified illumination. An illumination shape 21 shown in FIG. 24A includes two illuminations 22 corresponding to the two pole illumination. An illumination shape 21 shown in FIG. 24B includes four illuminations 23, other than the two illuminations 22. These four illuminations 23 are used for assisting the two pole illumination.

Moreover, the present embodiment is effective not only for lithography process using the modified illumination, but also for lithography process by which resolution is improved by adjusting the deflection state of light, and for lithography process using immersion exposure.

The photo mask of the present embodiment comprises a transparent substrate, and a pattern which is provided on the transparent substrate and is corresponding to the CG wiring pattern layouts of the present embodiment. The transparent substrate is, for example, a glass substrate. The pattern comprises a film including a light shielding film such as a Cr film. The film is located at a portion corresponding to the CG wiring pattern layout on the transparent substrate.

Second Embodiment

Figure 25A:
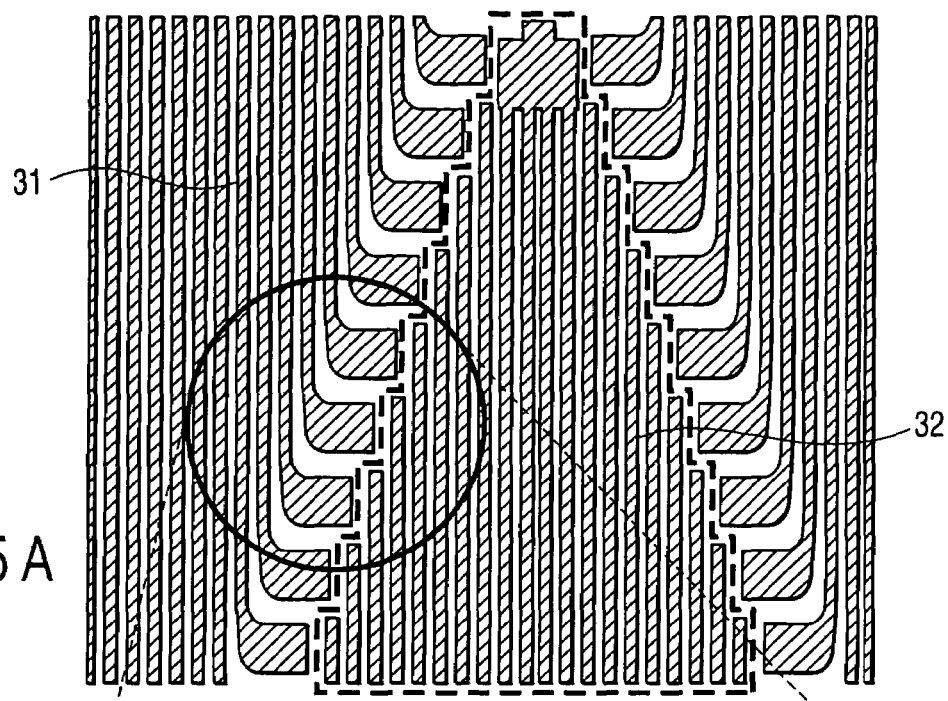
FIGS. 25A and 25B are views each showing a reference example of a method for arranging a dummy pattern.

FIG. 25A is a view showing an example of a method for arranging a dummy pattern based on the first embodiment.

A dummy pattern 32 with an L/S shape, which is enclosed with a dotted line in the drawing, is effective for improving the optical contrast of a main pattern (device pattern) 31, and EB exposure time and MDP processing time can be reduced by applying PPC to a fine pattern only and not applying PPC to a comparatively large convex pattern.

Figure 25B:
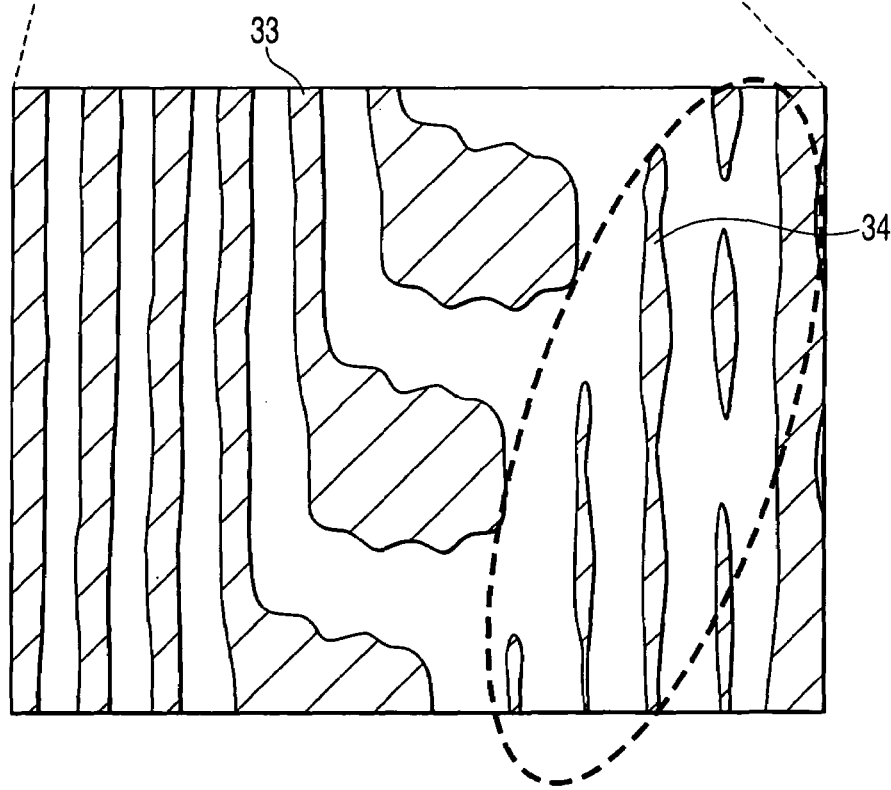

FIG. 25B shows an enlarged view of a part of simulation results obtained by exposure of a mask made by the above described method.

In the drawing, reference numeral 33 denotes the main pattern after the exposure, and reference numeral 34 denotes a dummy pattern after the exposure. According to the above results, it is observed that the isolated dummy pattern 34 enclosed with the dotted line becomes thin.

Figure 26:
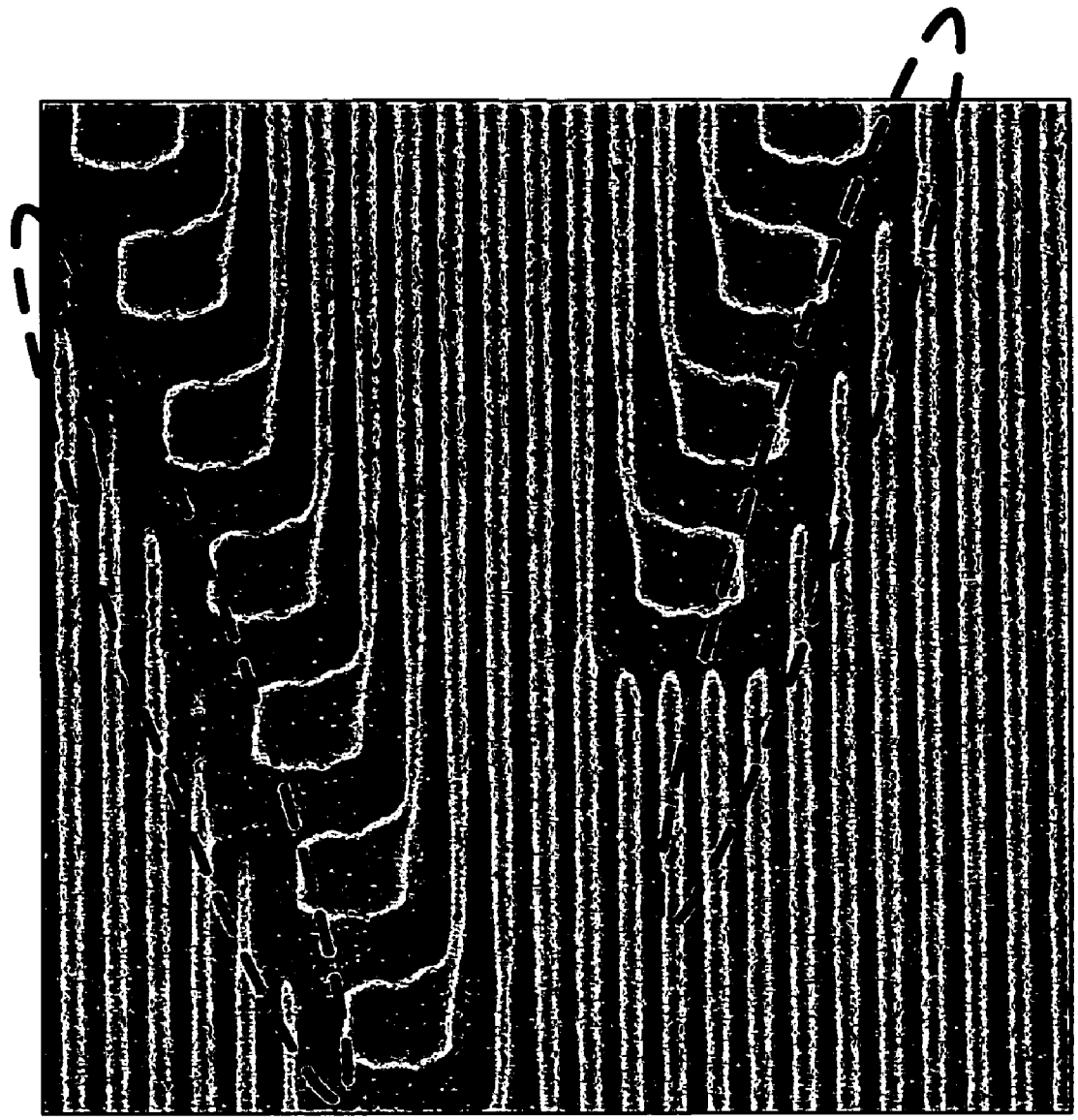
FIG. 26 is a view showing a result obtained by actual exposure on a substrate according to the method shown in FIGS. 25A and 25B.

Furthermore, FIG. 26 shows a microphotograph of results (image by a scanning electron microscope (SEM)) obtained by actual exposure on the substrate. Portions enclosed with dotted lines are a portion corresponding to the dotted line area shown in FIG. 25B, and it is understood that resist collapse is caused in a part of these portions.

It has been known that the fine pattern, which is isolatedly arranged as described above, has a thinner dimension by the influence of focus variations at exposure, or by that of the lens aberration in the aligner. Further, there is a possibility of danger that a pattern portion whose contact area with underlying film is small like a line tip portion causes "peeling" off the underlying film before a resist disappearance by dimensional reduction of the resist happens.

That is, the dummy pattern arranging method shown in FIGS. 25A and 25B can improve optical contrast of the main pattern, however, it can not be denied that there is possibility of causing the resist collapse. When dust caused by such the resist collapse is adhered on the main pattern, there is a possibility that open circuit or short circuit is caused. This causes a degradation of yield. Therefore, the dummy pattern shape which does not cause the resist collapse without lowering the optical contrast is required.

Here, the pattern indicate a line or space portion which has edges with a length of W or less, and has a shape in which edges with a length of W or more are connected from the both tops of the above described edges in the same direction, and the pattern tip indicates the vicinity of the both tops of the edges with a length W. Especially, when the following relation (1) is satisfied, the present embodiment is effective for the dimension W.

$$W/(\lambda/NA) \leq 0.32 \tag{1}$$

where $\lambda$ is an exposure wavelength, and NA is a lens numerical aperture of the aligner.

In the present embodiment, the resist collapse at the tip of the dummy pattern is prevented by improving the arrangement of the dummy pattern.

Figures 27A, 27B:
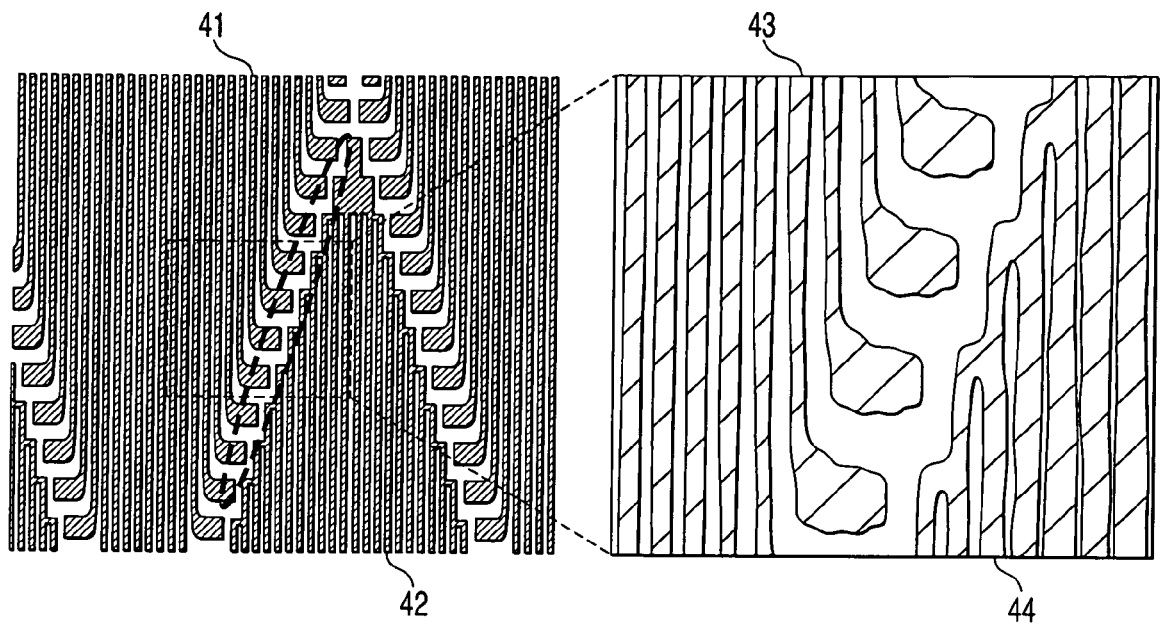
FIGS. 27A and 27B are views each showing an example of a method for arranging a dummy pattern according to an embodiment.

FIG. 27A shows a view of an example of the dummy pattern arrangement method according to the present embodiment, and FIG. 27B shows an enlarged view of a part of simulation results obtained by exposure of a mask made by the method. Here, reference numeral 41 denotes a device pattern, 42 denotes a dummy pattern, 43 denotes a device pattern after exposure, and 44 denotes a dummy pattern after exposure in FIGS. 27A and 27B.

Figure 28:
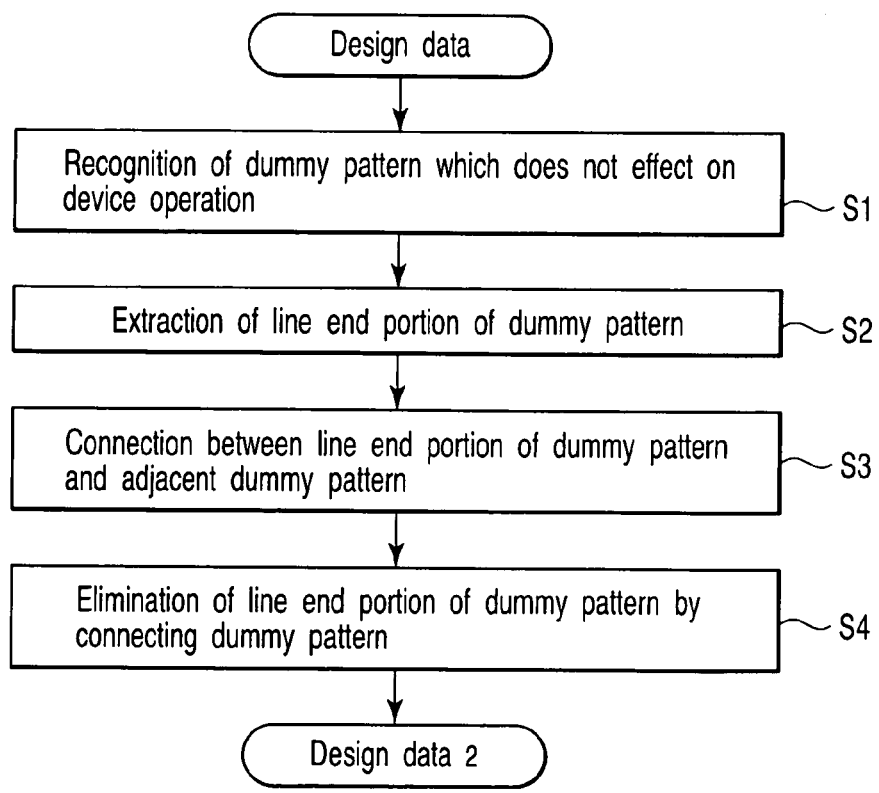
FIG. 28 is a flowchart showing procedures for making correction data from design data according to an embodiment.

The present embodiment illustrates a design layout by which the optical contrast is not reduced, and the resist collapse is not generated as described above. That is, as shown in the flowchart of FIG. 28, at first, a dummy pattern which does not effect on device operation is recognized (step S1), in the first place, from among design data of the semiconductor device corresponding to a pattern to be formed on a mask. Next, a line end portion in which the resist collapse is easily generated is extracted from the dummy pattern (step S2). Then, the extracted end portion is shared with a part of another adjacent dummy pattern. That is, the end portion is connected to the adjacent dummy pattern by newly providing a common dummy pattern between the extracted end portion and the adjacent dummy pattern (step S3). Thereby, the end portion of the dummy pattern is eliminated (step S4).

According to such a process, a layout by which the resist collapse is prevented from being generated can be made. At this time, the optical contrast for the main pattern (device pattern) can not be improved when a common portion which is shared between the line end portion of the dummy pattern and another dummy pattern is remarkably large. Then, it is preferable to form the common portion with a minimum necessary size in such a way that the resist collapse can be prevented at the line end portion.

Figures 37A, 37B:
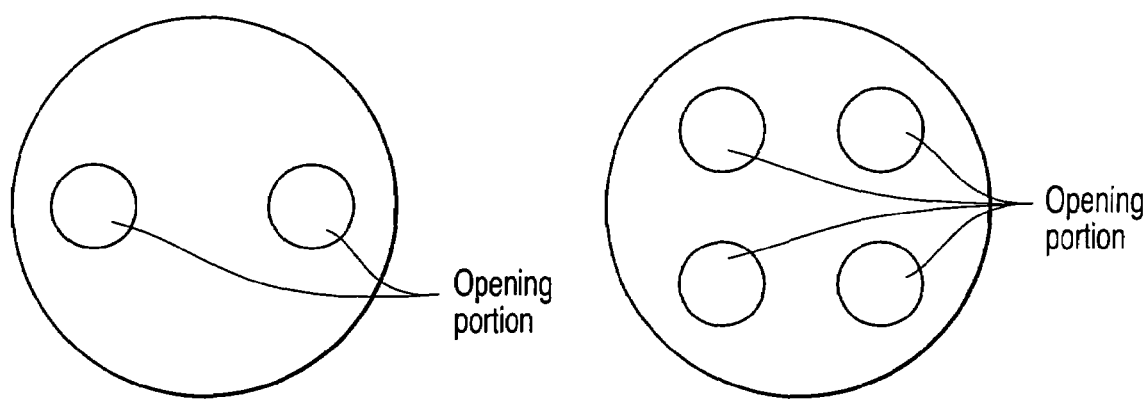
FIGS. 37A and 37B are plan views each showing an example of a special illumination shape.

Especially, when the line width W of the main pattern satisfies the above described expression (1), it is required to increase the resolution of the pattern by adopting a special shape for the illumination shape of the aligner. Specifically, the special shape means, for example, a special illumination shape such as the two pole illumination (FIG. 37A), or the four pole illumination (FIG. 37B). The range to exert influence on size of main pattern a range (called an optical distance) of influence on the dimension of the main pattern is increased by applying such illumination shape. When the above described expression (1) is satisfied, the optical distance becomes 1 µm or more, that is, the shape of the dummy pattern away from the main pattern by 1 µm or more exerts an effect on the dimension of the main pattern. In this case, it is important to decide the size of the common pattern in such a way that the influence of, especially, addition of the common dummy pattern to the line tip portion on the main pattern is controlled to be minimum. Moreover, the contrast of the main pattern is further effectively improved when the dummy pattern is arranged by a regular L&S space pattern.

As shown in FIG. 29A, the size of a shared dummy pattern 52 is set to be not less than half of line width (A) of a dummy pattern 51 and not higher than twice the size of the line width (A). Thereby, the improvement of the optical contrast to the main pattern is maintained. Then, in the present embodiment, a connection region with the adjacent pattern is set to be not less than half of line width (A) of the dummy pattern 51 and not higher than twice the size of the line width (A), however, the size of the connection region is not limited to the above range. The best size value of the connection area with the adjacent pattern may be decided by, for example, lithography simulation. Further, the best size value of the connection area with the adjacent pattern may be experimentally decided by using an actual resist shape.

Moreover, the influence on the optical contrast of a main pattern existing in the vicinity of a dummy pattern is controlled to be minimum by sharing each line tip portion with a minimum size when the line terminations of the dummy patterns 51 have a linear arrangement as shown in FIG. 29B. Thereby, the resist collapse can be prevented.

As described above, according to the present embodiment, a dummy pattern is recognize from design data, a line end portion forming the dummy pattern is extracted, and the extracted end portion connecting is connected with an adjacent dummy pattern, so that pattern collapse of the line end portion or a defect pattern is prevented. Thereby, the process margin in lithography process and the manufacturing yield of a device are improved.

Third Embodiment

FIGS. 30A and 30B each show the shape of a finished resist on a wafer after lithography process of a line tip portion.

In FIGS. 30A and 30B, reference numeral 61 denotes a device pattern after exposure, and 62 denotes a dummy pattern after exposure. In FIGS. 30A and 30B, a solid line indicates the plan shape of a mask pattern after PPC, and a dotted line indicates a design pattern. That is, the plan shape of the finished resist on the wafer, which is calculated from the mask pattern after PPC, is shown.

FIG. 30A indicates a case where another pattern is located at a position about 0.8 µm away from a line end portion, and FIG. 30B indicates a case where another pattern is located at a position about 0.4 µm away from a line end portion. Here, another pattern opposing to the line end portion is not necessarily limited to the dummy pattern, but also it may be a device pattern.

It is found in FIGS. 30A and 30B that the shapes at the line tip portions are different from each other. In the shape shown in FIG. 30A, and contact area between the tip portion and the underlying film is more sufficiently secured in comparison with that of FIG. 30B. In FIG. 30B, the tip portion is sharp, and the contact area cannot be secured enough. As a result, the shape shown in FIG. 30B has a higher possibility that the resist collapse is caused in the line end portion. Therefore, the shape shown in FIG. 30A is preferable from the viewpoint of the lithography process.

Figure 31B:
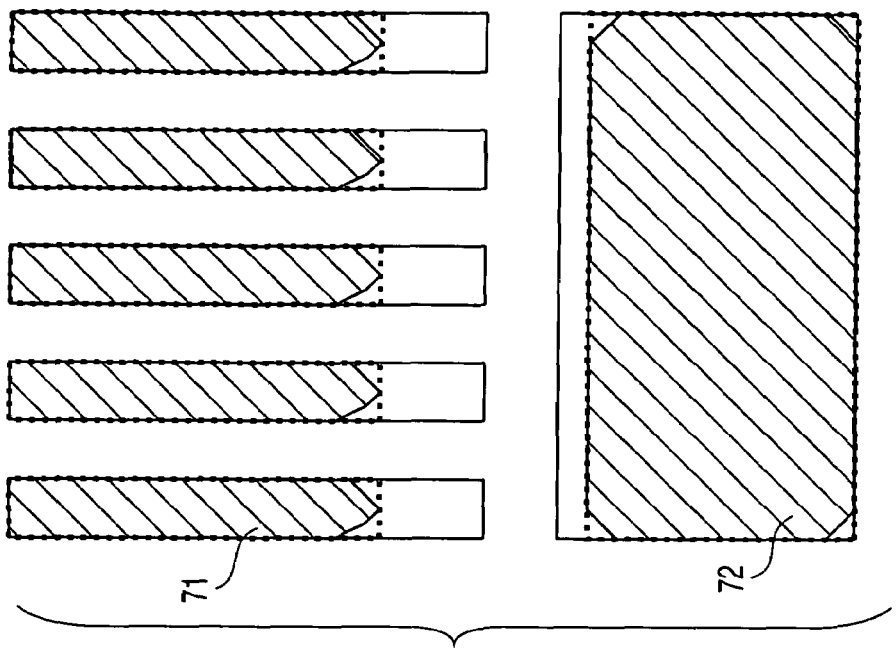
FIGS. 31A and 31B are views showing a finished shape after etching of underlying layer of resist using a resist shape shown in FIGS. 30A and 30B.
Figure 31A:
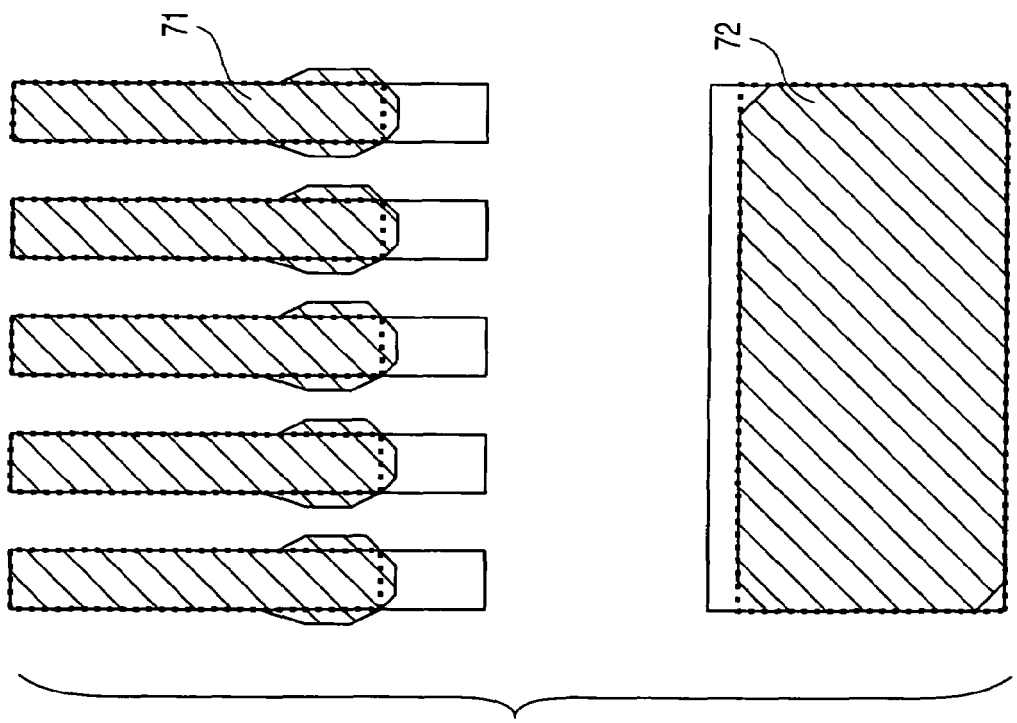

On the other hand, FIGS. 31A and 31B show finished shapes after etching of an underlying layer of resist using the resist shape shown in FIGS. 30A and 30B.

In FIGS. 31A and 31B, reference numeral 71 denotes a device pattern after etching, and 72 denotes a dummy pattern after etching. In FIGS. 31A and 31B, the plane shapes of the mask patterns after PPC are represented with a dotted line, respectively, and the design patterns are represented with a solid line, respectively, in the same manner as those of FIGS. 30A and 30B.

In FIG. 31A, an area to be etched is large, because a distance between the line end portion of the device pattern 71 and the dummy pattern 72 opposing to the line end portion is large. Therefore, reaction substance formed at etching is easily adhered to the line end portion as a sidewall deposition. As a result, there is a possibility that the line end portion is in contact with the opposing pattern on the wafer to cause an electrical short. Moreover, an area to be etched area is smaller than that of FIG. 31A in FIG. 31B, because a distance between the line end portion and another pattern is shorter. Thereby, a smaller amount of the reaction substance is adhered as sidewall deposition in FIG. 31B. That is, the shape shown in FIG. 31B is more preferable in comparison with that of FIG. 31A from the viewpoint of etching, because the resist shape can be more faithfully reproduced.

Figure 32:
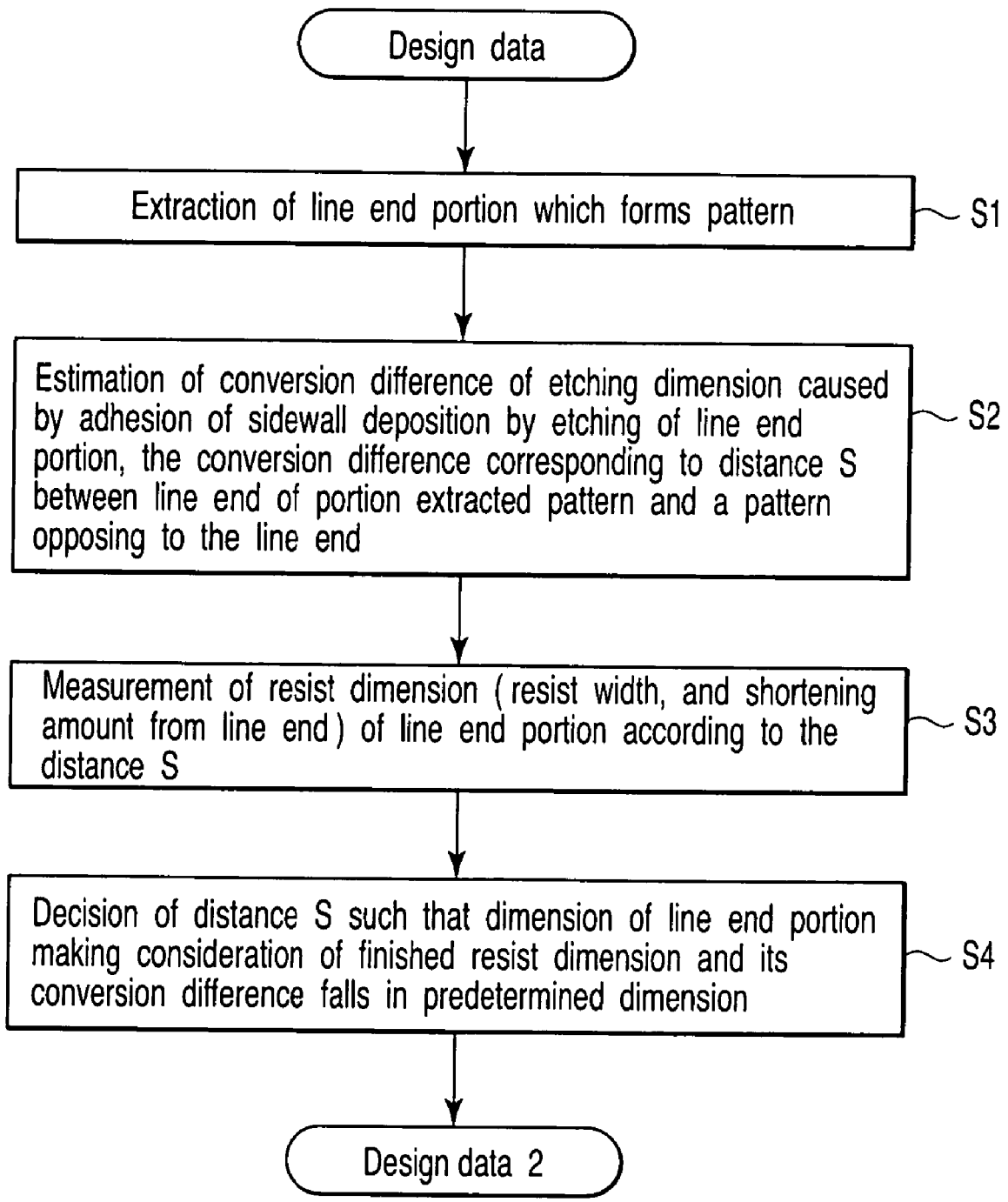
FIG. 32 is a flowchart showing procedures for making correction data from design data according to an embodiment.

In the present embodiment, an amount of a sidewall deposition adhered to the line end portion after etching is estimated according to the distance between a line end portion and another pattern from the above viewpoints, accordingly, variations in a resist dimension of the line end portion, and a shortening amount of the line tip portion are estimated. The flowchart for the above case is shown in FIG. 32.

Figure 36:
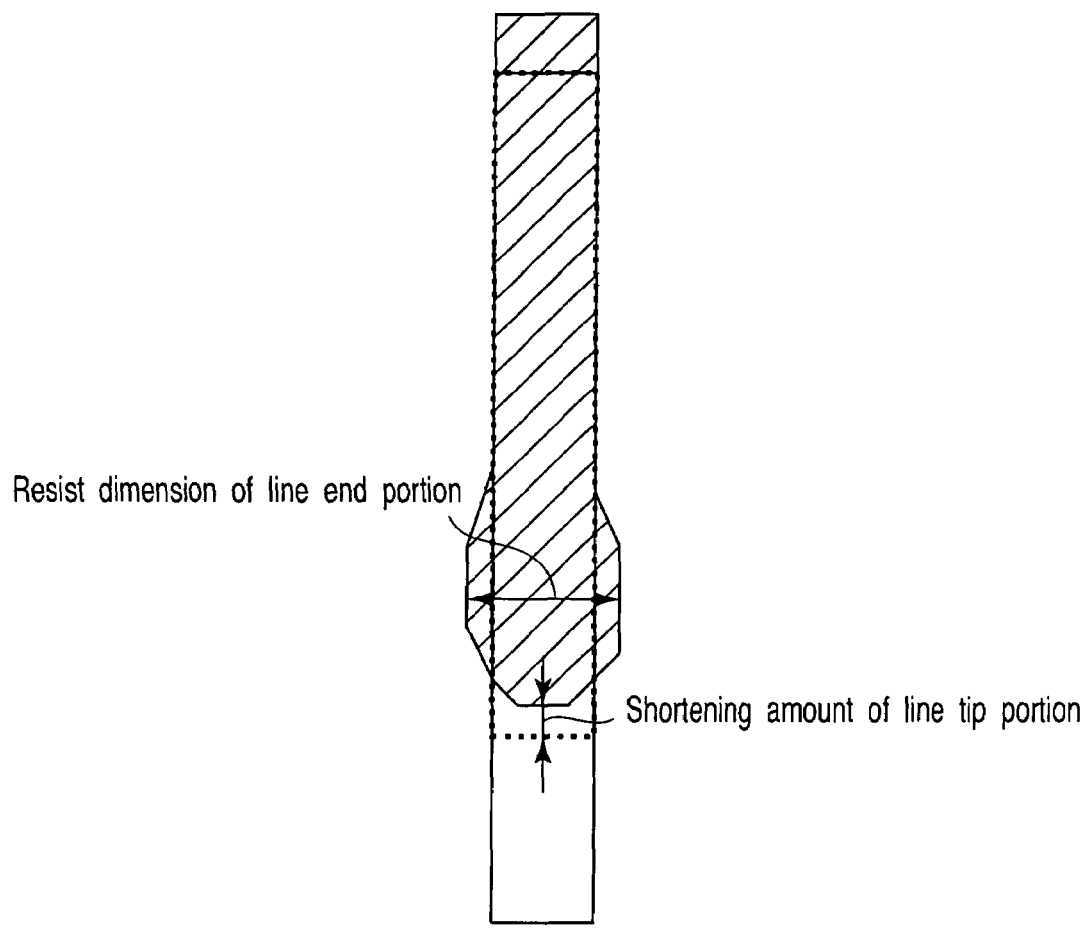
FIG. 36 is a view for defining a resist dimension of a line end portion.

At first, an end portion of a line forming a device pattern is extracted (step S1). Next, a relation between a distance S between the extracted end portion and a dummy pattern opposing to the end portion, and a conversion difference in etching dimensions at the line end portion, which is caused by adhered sidewall deposition at etching using a resist as a mask is measured (step S2). Then, a relation between a finished resist dimension of the line end portion by lithography process, and the distance S is measured (step S3). Next, the value of the distance S is decided (step S4) in such a way that a finished dimension of the line end portion considering the conversion difference of the etching dimension and the finished resist dimension falls in a predetermined dimension. Here, the resist dimension of a line end portion denotes a dimension for a location shown in FIG. 36.

Figure 33A:
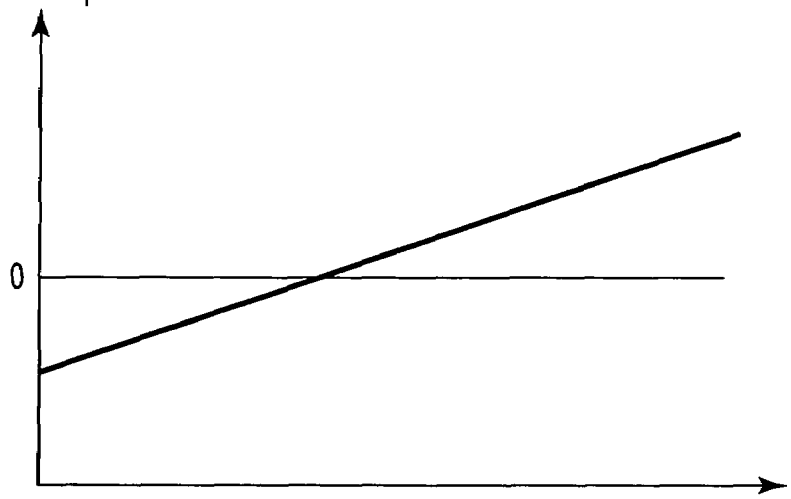
FIGS. 33A and 33B are views each showing a relation between a distance S between a line tip portion and a pattern opposing to the line tip portion and an etching conversion difference at a line end portion.
Figure 33B:
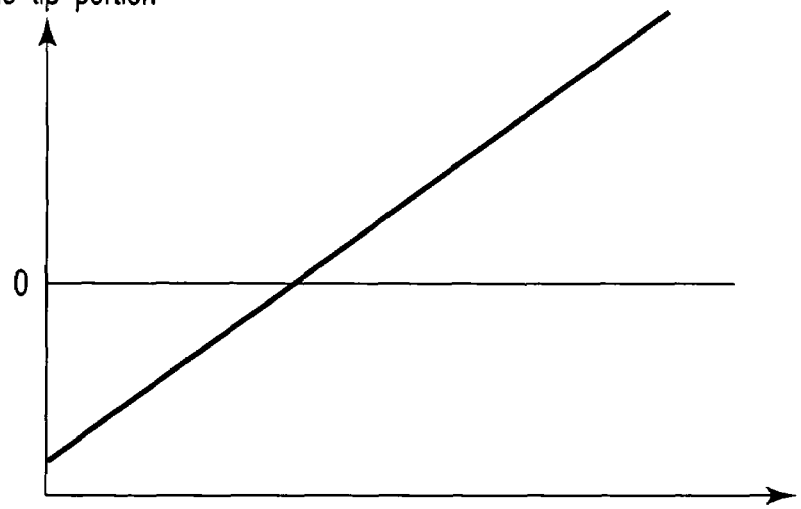

In FIG. 33A, a horizontal axis indicates a distance S between a line tip portion and a pattern opposing to the tip portion, a vertical axis indicates a amount of dimensional variation of a line end portion caused by adhered deposition on a sidewall at etching (etching conversion difference: a difference between a dimension after etching and a resist dimension). In FIG. 33B, a horizontal axis indicates a distance S between a line tip portion and a pattern opposing to the tip portion, a vertical axis indicates a amount of dimensional variation of a line tip portion caused by adhered deposition on a sidewall at etching. It is found that both variations in the dimension of the line end portion at etching and those in the dimension of the line tip portion are increased in a plus direction as the distance S becomes larger.

Figure 34A:
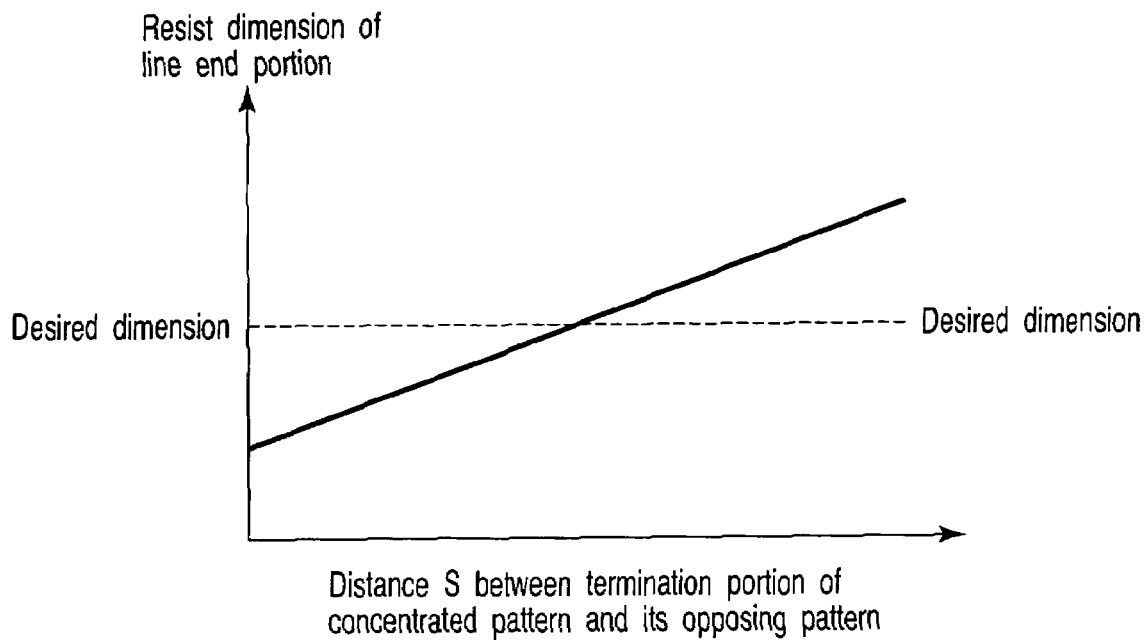
FIGS. 34A and 34B are views each showing a relation between a distance S between a line tip portion and a pattern opposing to the line tip portion and a resist dimension of a line end portion and line tip portion, and shortening amount.
Figure 34B:
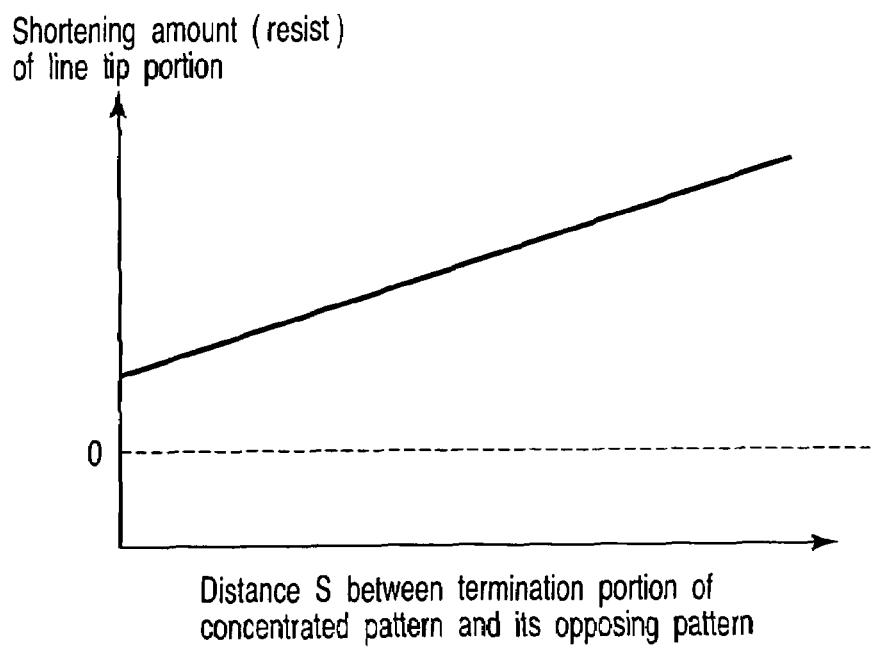

Further, the distance S, the resist dimension of the line end portion, and the shortening amount of the line tip portion are estimated by lithography simulation. FIG. 34A is for the resist dimension of the line end portion, and FIG. 34B is for the shortening amount of the line tip portion. The above drawings are obtained under a specific exposure conditions, and depend on the exposure wave length of an aligner, the lens numerical aperture of the aligner, an illumination shape, the line width of a pattern, PPC conditions (jog length), and like.

Figure 35A:
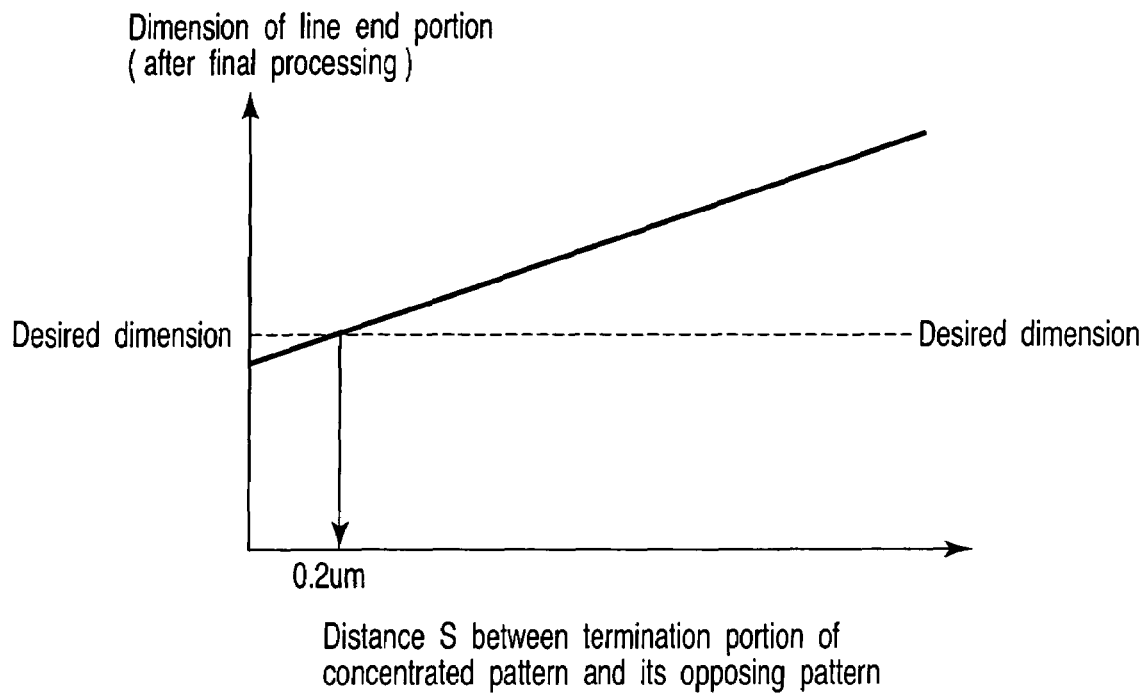
FIGS. 35A and 35B are views showing a relation between a distance S between a line tip and a pattern opposing to the line tip and a resist dimension of a line end and line tip, and shortening amount.
Figure 35B:
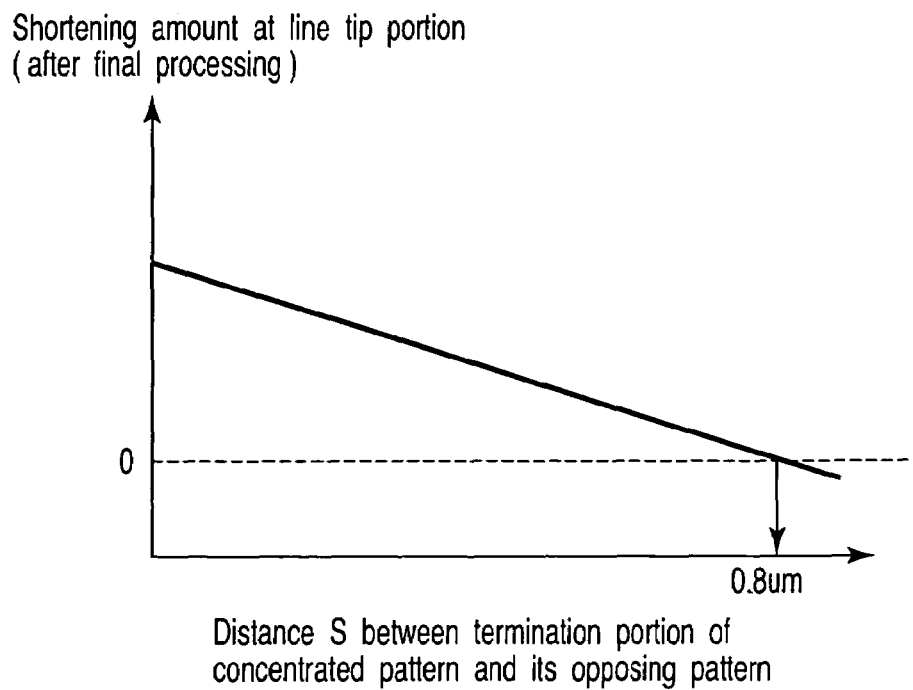

Finished dimensions after final processing considering a resist dimension and an etching conversion difference by using FIGS. 33A, 33B, 34A, and 34B are shown in FIGS. 35A and 35B. The finished dimension of the line end portion has a tendency that both a resist dimension and processing conversion difference increases as the distance S is increased according to FIGS. 33A and 34A, so that the finished dimension of the line end portion is shown as in FIG. 35A. At this time, it is estimated that the distance S is 0.2 μm when the finished dimension of the line end portion is a desired dimension.

On the other hand, it is found from FIG. 34A that the shortening amount of the line tip portion is increased as the distance S is increased at a resist stage. On the contrary, it is found from FIG. 33B that the shortening amount reduced by etching is smaller because there is a tendency that the shortening amount is smaller by etching. The reason is that the inclination to the distance S is larger in FIG. 33B than that of FIG. 34B. As a result, the shortening amount after final processing becomes as shown in FIG. 35B, and it is found that the shortening amount becomes zero at S=0.8 μm.

In this case, the value of S is required to be decided from an allowable shortening amount of this pattern and an allowable amount of the line end portion. It is important whether the shortening amount is allowable, and depends on a relation of dimension between this layer and another different layer. A factor deciding the shortening amount depends, for example, on a distance between the line tip portion and a position at which a contact hole is arranged, or on possibility that a pattern lies over a diffusion layer by shortening if the pattern is a gate.

On the other hand, a factor deciding an allowable dimension of the line end portion is, for example, whether or not neighboring line end portions can have a resolution with enough margin (process margins of lithography process and etching), or whether or not a space portion can be embedded between line end patterns.

From these viewpoints, the value of the distance S is generally decided between S=0.2 μm (a condition that a desired pattern dimension of a line end portion is obtained), and S=0.8 μm (a condition that a shortening amount becomes zero. If it is judged that there is no distance S which satisfies a specification between the above range, it is required to review process conditions including exposure conditions, PPC conditions, and, furthermore, a design rule, or a design pattern layout. But this requires a very large amount of work, so, even if it is judged that the specification is not satisfied, by assuming that those patterns as a routine dimension control point at a factory, it is possible to perform a tuning of process in such a way that the allowable shortening amount, allowable dimension of the line end portion are realized.

It is confirmed that a shape of the line end portion is formed stably on a wafer by calculating the dimension of the line end portion and the distance S which permits an allowable shortening amount according to the above described technique, by arranging another pattern at the position, if necessary, by performing routine dimension control for those locations at factory, further by adjusting process conditions, layouts, design rules, and PPC conditions.

In the present embodiment, in order to decide the distance S between a line end portion of a pattern group and a pattern opposing to the line end portion, a resist dimension of a lithography process (resist width) and a shortening amount, and an etching conversion difference are used, however, the above decision can be performed adding device characteristics, concretely, electric characteristics, timing analysis, and the like to the above conditions.

As described above, pattern collapse of the line end portion or a defect pattern can be prevented according to the present embodiment by extracting a line end portion forming a device pattern from pieces of design data, and by appropriately setting a distance S between the extracted end portion and a pattern opposing to the end portion. Accordingly, a process margin of lithography process, and the manufacturing yield of a device can be improved.

Here, the present invention is not limited to the above described embodiments. For example, in the first embodiment, the CG wiring pattern layout is explained, however, the present invention is effective, for example, for the layout of other circuit patterns in other NAND type flash memory. Further, the present invention is effective for a layout of a circuit pattern in a semiconductor device other than NAND type flash memory.

Further, in the second and third embodiments, the line end portion forming a dummy pattern or a device pattern is extracted, instead of it, an end portion of a space is extracted, and based on the space end portion, the arrangement or resist dimension of a common pattern, and a conversion difference in etching dimensions may be measured. Furthermore, in the second and third embodiments, the method for making a mask pattern is described, a photo mask can be manufactured by forming a mask pattern on a mask substrate using the above method. Moreover, a semiconductor device can be manufactured by forming a pattern of a semiconductor layer on a resist on a semiconductor substrate using the above photo mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a circuit pattern group comprising at least N (N≧2) pieces of circuit patterns provided on the semiconductor substrate,
      at least one vicinity of end portion among the at least of N pieces of circuit patterns including a connection area to electrically connect to a circuit pattern in another circuit pattern group being different from the circuit pattern group,
      the N pieces of circuit patterns including a circuit pattern N1 and at least one circuit pattern Ni (i≧2) arranged in one direction being different from a longitudinal direction of the circuit pattern N1,
      the at least one circuit pattern Ni having larger i being arranged at a further position away from the circuit pattern N1, and in terms of a pattern including the connection area among the at least of N pieces of circuit patterns, the larger the i, the connection area being arranged at a further position in the longitudinal direction.

2. The semiconductor device according to claim 1, wherein in each of circuit pattern Nj (j≧1), width of the connection area is wider than that of the circuit pattern.

3. The semiconductor device according to claim 1, wherein the circuit pattern group further comprises a dummy pattern.

4. The semiconductor device according to claim 1, wherein N pieces of the circuit patterns are arranged such that connection area of circuit pattern Nj (j≧1) and the connection area of the circuit pattern Nj+1 does not overlap one another with respect to the one direction.

5. A method for making a pattern layout on a substrate, comprising:
   defining a circuit pattern N1 as a reference for arranging N (N≧2) pieces of circuit patterns in a first circuit pattern group, each of the N pieces of the circuit patterns including a connection area to electrically connect to a circuit pattern in a second circuit pattern group different from the first circuit pattern group, wherein the circuit pattern N1 belongs to the N pieces of the circuit patterns;
   arranging at least one circuit pattern Ni (i≧2) in one direction different from a longitudinal direction of the circuit pattern N1, the at least one circuit pattern Ni having larger i being arranged at a further position away from the circuit pattern N1, wherein the at least one circuit pattern Ni belongs to the N pieces of the circuit patterns;
   enlarging the at least one circuit pattern Ni in the longitudinal direction, the at least one circuit pattern Ni having larger i being enlarged larger; and
   forming the pattern layout onto the substrate.

6. The method for making a pattern layout according to claim 5, wherein in each of circuit patterns Nj (j≧1), width of the connection area is wider than that of the circuit pattern.

7. The method for making a pattern layout according to claim 5, wherein the circuit pattern group further comprises a dummy pattern.

8. The method for making a pattern layout according to claim 7, wherein the dummy pattern includes a dummy pattern to be a subject of optical proximity correction, and a dummy pattern not to be a subject of optical proximity correction.

9. The method for making a pattern layout according to claim 7, wherein the dummy pattern includes a line & space pattern and a large pattern including a dimension for defining size of the large pattern, and the dimension is larger than that of the line & space pattern.

* * * * *

UNITED STATES PATENT AND TRADEMARK OFFICE
CERTIFICATE OF CORRECTION

PATENT NO. : 7,716,617 B2  Page 1 of 1
APPLICATION NO. : 11/299843
DATED : May 11, 2010
INVENTOR(S) : Mashita et al.

It is certified that error appears in the above-identified patent and that said Letters Patent is hereby corrected as shown below:

Title page, Item (73), in the Assignee, change "Tosbhia," to --Toshiba--.

Title page, Item (57), in the Abstract, line 3, change "pattern" to --patterns--.

Signed and Sealed this

Sixth Day of July, 2010

David J. Kappos
*Director of the United States Patent and Trademark Office*